United States Patent [19]

Levin et al.

[11] 4,316,254
[45] Feb. 16, 1982

[54] PORTABLE PHASE ANGLE METER INSTRUMENT

[75] Inventor: Harry P. Levin; of N. Hollywood, Calif.

[73] Assignee: Electric Power Research Institute, Inc., Palo Alto, Calif.

[21] Appl. No.: 42,671

[22] Filed: May 25, 1979

[51] Int. Cl.³ .................. G06F 15/20; G01R 25/00
[52] U.S. Cl. .................. 364/481; 324/72.5; 324/83 D; 324/86; 324/87; 364/483
[58] Field of Search .......... 364/481, 483, 484; 328/133; 324/57 R, 72, 72.5, 83 R, 83 A, 83 D, 86, 87, 149, 158 P

[56] References Cited

U.S. PATENT DOCUMENTS

| | | | |
|---|---|---|---|
| 3,193,765 | 7/1965 | Bevins | 324/72.5 X |
| 3,265,969 | 8/1966 | Catu | 324/72.5 |
| 3,286,176 | 11/1966 | Birnboim | 364/481 X |
| 3,392,334 | 7/1968 | Bevins | 324/72.5 X |
| 3,402,351 | 9/1968 | Kradel | 324/87 |
| 3,584,299 | 6/1971 | Csete | 324/86 |
| 3,646,455 | 2/1972 | Coccagna | 324/83 D X |
| 4,025,848 | 5/1977 | Delagrange et al. | 324/83 D |
| 4,075,697 | 2/1978 | Ochiai et al. | 364/481 |

Primary Examiner—Jerry Smith
Attorney, Agent, or Firm—Nilsson, Robbins, Dalgarn, Berliner, Carson & Wurst

[57] ABSTRACT

A portable phase angle meter instrument for use on electric utility power distribution systems.

A portable phase angle meter instrument is interconnected between two distribution conductors to generate a voltage signal and current signal substantially in phase with the voltage across the conductors and the current in one of the conductors respectively. A potential probe with a conductive hook for interconnection to a first conductor, houses a first capacitor. A current probe assembly housing a second capacitor, has a head for interconnection to a reference conductor. The head has a Hall sensor or a transformer sensor for generating a current signal substantially in phase with the reference conductor current, and a plate for making electrical contact with the reference conductor. The capacitors are interconnected in series between the plate and the hook via a high voltage cable. Circuitry in a housing attached to the current probe is coupled between the second capacitor and the plate for generating a voltage signal substantially in phase with the voltage between the conductors. The current and voltage signals are digitized and processed to generate a lead signal when the current leads the voltage and a lag signal when the current lags the voltage. Registers accumulate counts of clock pulses of the lead and lag signals and the total number of clock pulses which occur during a selected period of time. Phase angle is calculated from the accumulated counts in the registers.

15 Claims, 18 Drawing Figures

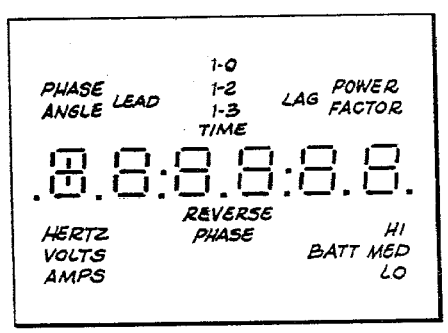
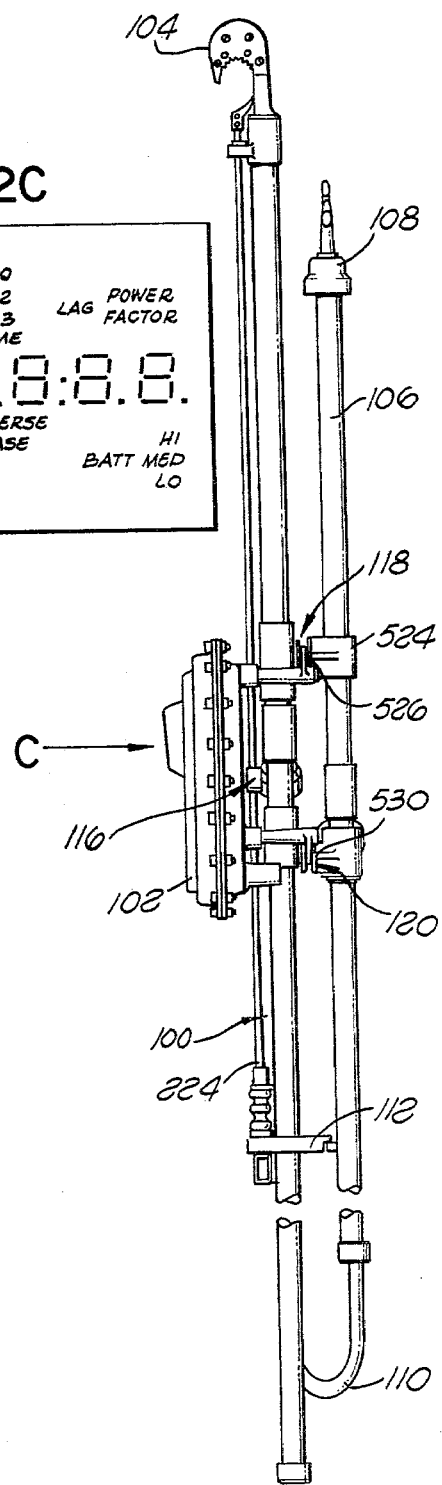
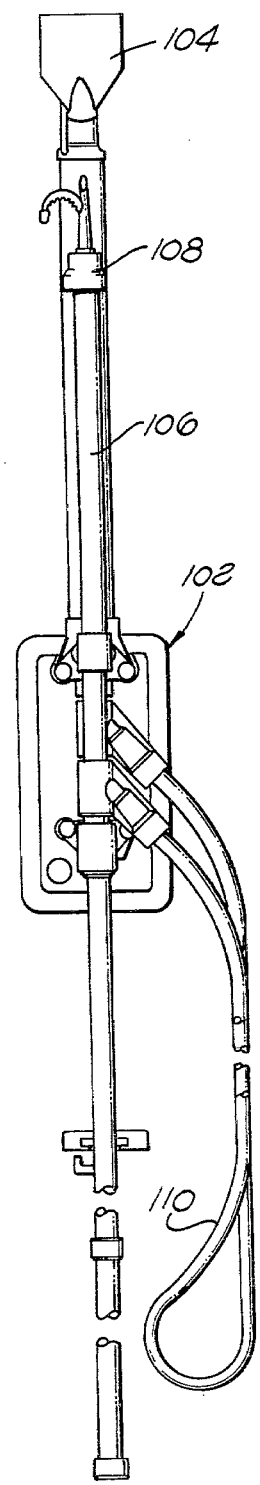

4,316,254

PORTABLE PHASE ANGLE METER INSTRUMENT

BACKGROUND OF THE INVENTION

The present invention relates to phase angle meters and in particular, to a portable phase angle meter instrument useful in measuring the phase angle between the voltage and the current in a utility power distribution system.

Phase angle measurements generally require installation of current and potential transformers at various locations in the power distribution system. Such installations are time consuming, expensive and frequently disturb the operation of the power distribution system. Presently, there is no portable phase angle measuring instrument for making direct phase angle measurements at distribution system voltages. Consequently, substantial uncompensated phase shifts between the voltage and current occur in distribution feeders causing substantial inefficiencies in the distribution network.

In order to increase the efficiency of such electrical power distribution networks and to decrease the apparent power losses due to phase unbalance and shift, particularly in feeder lines which have no in place instrumentation it is desired to have a portable instrument which may be hooked across two power distribution feeder lines and generate a current signal which in phase with the current in one of the conductors and a voltage signal which is substantially in phase with the voltage between the conductors.

The present invention provides an instrument, embodied in a portable "hot stick" for measuring phase angle on energized distribution feeders without interfering with their operation. Complete safety to the operation is provided even though the hot stick instrument is connected directly to conductors having a voltage up to about 35,000 volts carrying and a current up to about 800 amps.

The present portable instrument may be used on single phase, or 3-phase star connected power distribution systems where the phase angle between voltage and current may be read phase to neutral, without further correction, or in delta connected distribution systems where an appropriate correction factor of 30° is either added or subtracted from the phase angle measurement.

The invention also provides a reverse phase detection means to indicate that the portable hot stick instrument is attached to the power distribution conductors in a reverse position with respect to the direction of the feeding bus.

The elements of the phase angle meter instrument, in accordance with the invention, include a current probe assembly, a potential probe assembly and an electronic circuitry enclosure assembly attached to the current probe assembly.

More specifically, the current probe assembly generally comprises an insulated pole with a sensing head attached to its upper end and an electronic circuitry enclosure attached at substantially mid-pole. A high voltage capacitor having a capacitance of about 0.001 microfarads is positioned inside the current probe pole.

The sensor head has two basis elements. First, a conductive plate by which the sensor head makes direct electrical contact with a reference conductor, and secondly, a current sensing device including the associated circuitry to generate a signal which is either related to or in phase with the current in the reference conductor. This signal will hereinafter be referred to as the "current signal".

In one embodiment, the current sensing device comprises a Hall generator with associated circuitry necessary to generate the current signal.

In an alternative embodiment, the current sensing device may be a transformer type device which is enclosable about the reference conductor. In this embodiment a first current signal is derived from the secondary windings of the transformer. This first current signal may be transformed again to produce a second current signal, which is then digitized as hereinafter explained.

Regardless of the type of current sensing device utilized, the resultant current signal has a fixed phase relationship with the current in the reference conductor. The current signal is coupled to the circuitry in the enclosure assembly which is attached to the current probe housing.

The potential probe assembly comprises an insulated pole with a conductive hook on one end for being hooked over a first conductor. A high voltage capacitor having a capacitance of about 0.001 microfarads is positioned in the interior of the potential probe pole and is coupled to the current probe capacitor via a high voltage cable. The conductor hook, the potential probe capacitor, the current probe capacitor, a filter circuit in the enclosure assembly, and the plate of the current probe sensing head are coupled in series. Appropriate processing circuitry is coupled across the filter circuit to generate a signal which has a fixed phase relationship with the voltage between the first conductor and the reference conductor. This signal will hereinafter be referred to as the "voltage signal".

Circuitry is next provided to digitize the current and voltage signals. The digitized current and voltage signals vary between a zero voltage level and a normalized non-zero voltage level, hereinafter referred to as being a (logical) zero and a (logical) one, respectively.

The digitized voltage signal makes the transition from zero to one upon the occurrence of a positive going zero crossing of the voltage signal and makes the transition from one to zero upon the occurrence of a negative going zero crossing of the voltage signal.

The digitized current signal similarly varies between zero and one making a zero to one transition upon the occurrence of a positive going zero crossing of the current signal and a one to zero transition upon the occurrence of a negative going zero crossing of the current signal.

The digitized current and voltage signals are next coupled to a microcomputer which includes combining circuitry, counting circuitry and a microprocessor. The digitized voltage signal (E) and the digitized current signal (I) are combined in an exclusive OR gate to generate a signal which is at one whenever the logic levels of the digitized voltage signal and the digitized current signal are not the same (i.e. E'=I), thus indicating either a lead or a lag condition. This signal is then coupled to logic circuitry which generates a lead signal or a lag signal depending on whether the current is leading or lagging the voltage signal. The lead or lag signal are next combined with the E'=I signal and a clock signal in a NAND gate to generate a pulse train, in which clock pulses occur only during the time that the digitized current signal and the digitized voltage signal are not at the same logic levels and the current either leads or lags the voltage.

The number of pulses which occur during lead conditions over a specified period of time, preferably in terms of 36 cycles of the digitized voltage signal, are accumulated in a first register designated the lead register. Similarly, the number of pulses which occur during lag conditions over the same specified period of time are accumulated in a second register designated the lag register. Concurrently, the total number of pulses which occur during the specified period of time are accumulated in a register designated the window register.

At the end of the specified period of time, the accumulated count in the three registers are combined by a microprocessor according to a programmed algorithm to compute the phase angle. The phase angle may then be corrected by adding or subtracting appropriate angles and constants. The microprocessor provides a value of phase angle which may be displayed on a display or may compute the power factor directly by taking the cosine of the phase angle and thereafter display the value of the power factor.

SUMMARY OF THE INVENTION

A portable phase angle meter instrument is provided for interconnection between a first conductor and a reference conductor. The instrument comprises a potential probe having a first contact means, for making electrical contact with the first conductor, and a first capacitor. The instrument also includes a current probe comprising a sensor head having a second contact means for making electrical contact with the reference conductor and a current sensing assembly for generating a current signal which is substantially in phase with the current in the reference conductor; and a second capacitor. A cable is provided for interconnecting the first capacitor and the second capacitor so that the first contact means, the first and second capacitors, and the second contact means are interconnected in series for generating a voltage signal which is substantially in phase with the voltage between the first conductor and the reference conductor. Finally, the portable sensor instrument incorporates a processing means for receiving the current signal and the voltage signal. The processing means comprises means for digitizing the current signal and the voltage signal, means for combining the digitized voltage signal and the digitized current signal and generating therefrom a measure of the phase difference between the current signal and the voltage signal and finally, means for displaying the generated measure of the phase difference.

In one embodiment of the invention, the current sensing assembly comprises a Hall effect sensing device positioned adjacent to the reference conductor. The sensing device has a Hall current coordinate, along which a Hall current flows, positioned substantially perpendicular to the circumferential magnetic field of the reference conductor.

In another embodiment of the invention, the current sensing assembly comprises a current transformer assembly having a core and at least one coil removably positioned adjacent to the reference conductor so that the current signal is induced in the coil in response to the alternating current in the reference conductor.

In the preferred embodiment, the first and second capacitors are high voltage capacitors and may, for example, have a capacitance of about 0.001 microfarads.

BRIEF DESCRIPTION OF THE DRAWINGS

The invention will be better understood from the detailed description below taken in conjunction with the drawings wherein like reference characters refer to like parts throughout and in which:

FIGS. 2A, 2B and 2C illustrate a preferred embodiment of the portable phase angle meter instrument shown with the potential probe assembly mounted on the current probe assembly;

DETAILED DESCRIPTION

System

Figure 1:
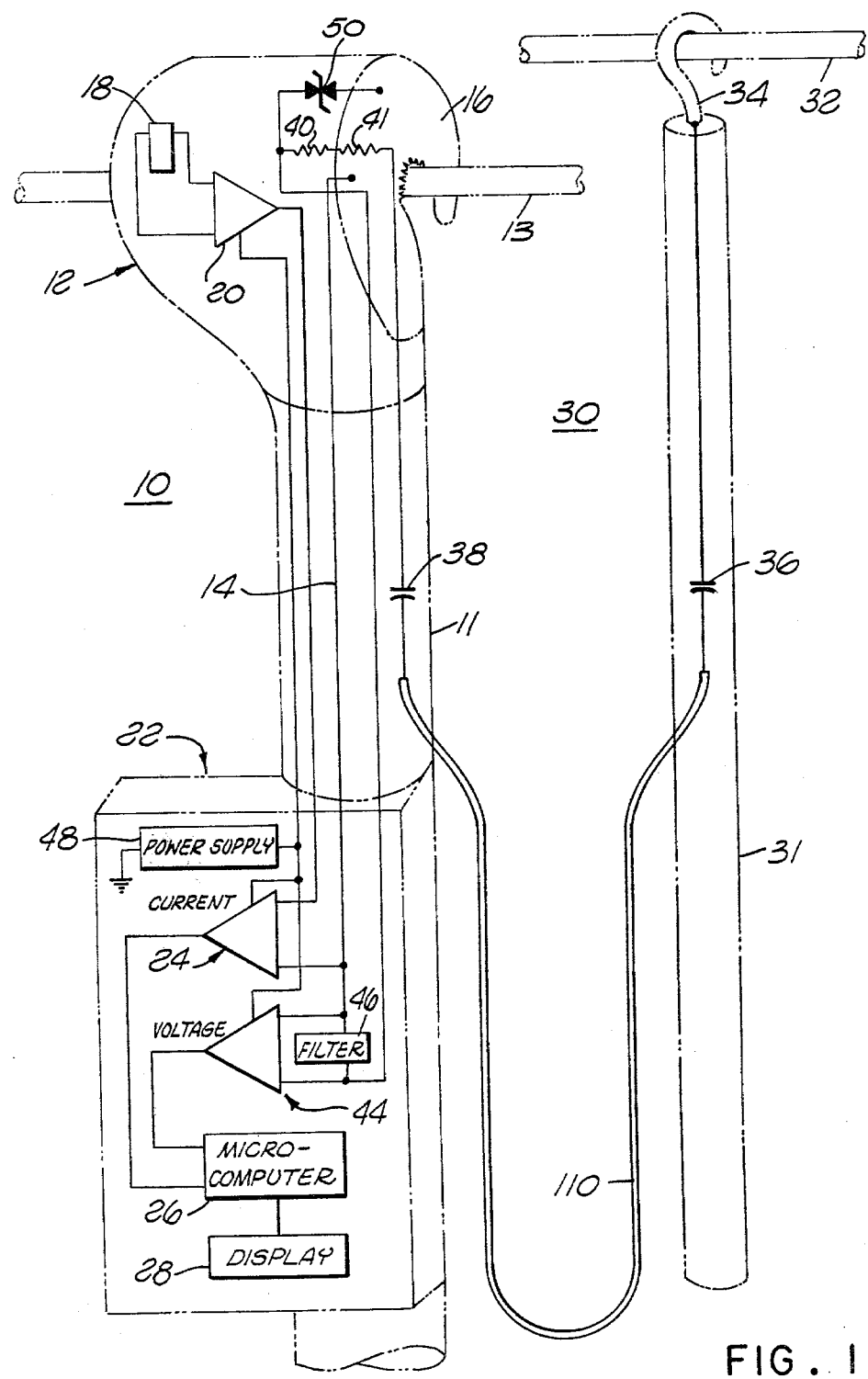
FIG. 1 is a block diagrammatic schematic representation of the portable phase angle meter instrument in accordance with the present invention.

Referring first to FIG. 1, a schematic of the present invention is illustrated comprising a current probe assembly 10 which has a sensing head 12 attached to the upper end of a current probe pole 11. Also attached to the current probe pole 11 is an enclosure assembly 22. The invention further comprises a potential probe assembly 30 having an electrically conductive hook 34 attached to the upper end of the potential probe pole 31.

Both the current probe pole 11 and the potential probe pole 31 are hollow in the required regions and are made of plastic or other non-conductive material. A first capacitor 36 is disposed in the hollow region of the potential probe pole 31 and is electrically interconnected to the hook 34. A second capacitor 38 is disposed in the hollow region of the current probe pole 11 and has one of its ends interconnected to two series resistors 40 and 41, which are in turn connected to a voltage input circuit 44 in the enclosure assembly 22. The second capacitor 38 and the first capacitor 36 are interconnected by a high voltage cable 110.

The sensing head 12 of the current probe assembly 10 is provided with at least one conductive side plate 16 attached along its side. Disposed inside the sensing head 12 a current sensor device generates a current signal substantially in phase with the current in a reference conductor 13. In one embodiment illustrated in FIG. 1, the current sensor device comprises a Hall sensor device 18 which is coupled to circuitry 20 to generate a clipped sine wave signal substantially in phase with the current in the reference conductor 13.

The current signal from the circuit 20 is coupled to the current comparator circuit 24 which performs additional shaping of the clipped sine wave current signal.

Transient protection circuitry is also provided across the input of the voltage input circuit 44. Such high voltage transients can occur when, eithr the current probe assembly 10, or the potential probe assembly 30, are initially attached to the energized conductors 13 and 32, respectively. Likewise there is a possibility of such transients whenever either probe is moved from conductor to conductor on a polyphase system, or due to the operation of the distribution system itself. It will be appreciated, of course, that the conductors 13 and 32 are power distribution lines which may be at potentials of several thousands of volts. In one embodiment, the transient protection circuitry may comprise a pair of resistors 40 and 41 which are coupled in series between the second capacitor 38 and one input of the voltage input circuit 44, in combination with bipolar zener diode 50 coupled between the resistors 40 and 41 and the conductive side plate 16. In the preferred embodiment, the bipolar zener diode 50 is attached directly to the conductive side plate 16.

Finally, an impedance means such as a filter circuit 46 is positioned between the signal input to voltage input circuit 44 and the reference ground. A reference ground lead 14, connected to the conductive side plate 16 extends through the current probe pole 11 to provide the reference voltage on the reference conductor 13 to the circuitry in the housing 22.

Also provided in the enclosure assembly 22 is a power supply 48 which may be a rechargeable battery. This power supply is coupled to supply power to the current comparator circuit 24 and the voltage input circuit 44, to the Hall sensor device 18, the circuit 20 in the sensing head assembly 12, as well as other circuits and devices (not shown) in the enclosure assembly 22.

As previously indicated, the output from the current comparator circuit 24 is a digitized square wave-like signal herein designated the first digitized current signal. The output signal from the voltage input circuit 44 is an amplified, clipped sine wave-like signal herein designated the amplified voltage signal. The amplified voltage signal is applied to a voltage comparator circuit, which is described in greater detail hereinafter, and which produces at its output a first digitized voltage signal. The first digitized current signal and the first digitized voltage signal are coupled to a microcomputer means 26 which includes combining, counting and microprocessor circuitry whereby the phase difference between the voltage signal and the current signal is determined and a power factor value computed. The resultant values from the microprocessor may then be displayed on a display 28 which displays any one of a plurality of parameters such as the phase angle between the current signal and the voltage signal, the power factor value, and other appropriate information.

In operation, the conductor hook 34 of the potential probe assembly 30 is positioned over the first conductor 32 so that the conductor hook 34 makes electrical contact with the first conductor 32. Similarly, the sensing head 12 of the current probe assembly 10 is positioned over the reference conductor 13 so that the conductive side plate 16 is in electrical contact with the reference conductor 13. A current signal and a voltage signal are then generated which are substantially in phase with the current in the reference conductor 13 and the voltage between the first conductor 32 and the reference conductor 13, respectively.

In the preferred embodiment of the invention, the phase shift between the current signal and the voltage signal is measured for each cycle with the phase shift being computed by averaging the cycle-to-cycle phase shift for a selected number of cycles, which in the present invention is selected to be 36 cycles of the voltage signal. The phase angle, or power factor, is then computed and displayed on the display 28. This information is required so that appropriate adjustments can be made in the power distribution network to maximize efficiency.

Referring now to FIGS. 2(A), 2(B) and 2(C), a specific embodiment of the present invention is illustrated having a current probe assembly 100, an enclosure assembly 102 attached to the current probe assembly 100, and a potential probe assembly 106 removably attached to the current probe assembly 100. The current probe assembly 100 and the potential probe assembly 106 are electrically interconnected by an insulated high voltage cable 110.

A current sensing head assembly 104, which may be a Hall sensor device or a transformer sensor to be described hereafter, is attached to the upper end of the current probe assembly. A cable hook 108 is interconnected to the upper end of the potential probe assembly 106 for hooking over the first conductor as previously described.

A control rod 224 is permanently attached along the first of the current probe assembly 100 so that the control rod 224 may be rotated and moved axially up and down relative to the current probe assembly 100. A magnet assembly 116 is attached at a central location of the control rod 224 behind the enclosure assembly 102. A corresponding first switch assembly (not show), activated by the field of the magnet assembly 116, is positioned in the interior of the enclosure assembly 102. The electrical circuitry in the enclosure assembly 102 may be turned ON and OFF by rotating the control rod 224 which in turn rotates the magnet assembly 116 to the appropriate position. Similarly, the operating mode of the electrical circuitry in the enclosure assembly 102 may be changed by moving the control rod 224 up or down which causes the mode selector second switch assembly within the enclosure (not shown) to be activated in the appropriate way by the field of the magnet assembly 116.

One feature of the invention is that the electronic circuitry must be turned OFF before the potential probe assembly 106 can be interconnected to the current probe assembly 100. This safety feature is provided by the combination of an upper attachment assembly 118, a lower attachment assembly 120 and an attachment safety assembly 112.

Specifically, the attachment safety assembly 112 prevents the potential probe assembly 106 from being attached to the upper attachment assembly 118 and the lower attachment assembly 120 unless the control rod 224 has been rotated to the OFF position. This safety feature will be described in greater detail hereafter.

Current Probe Assembly

Figure 3:
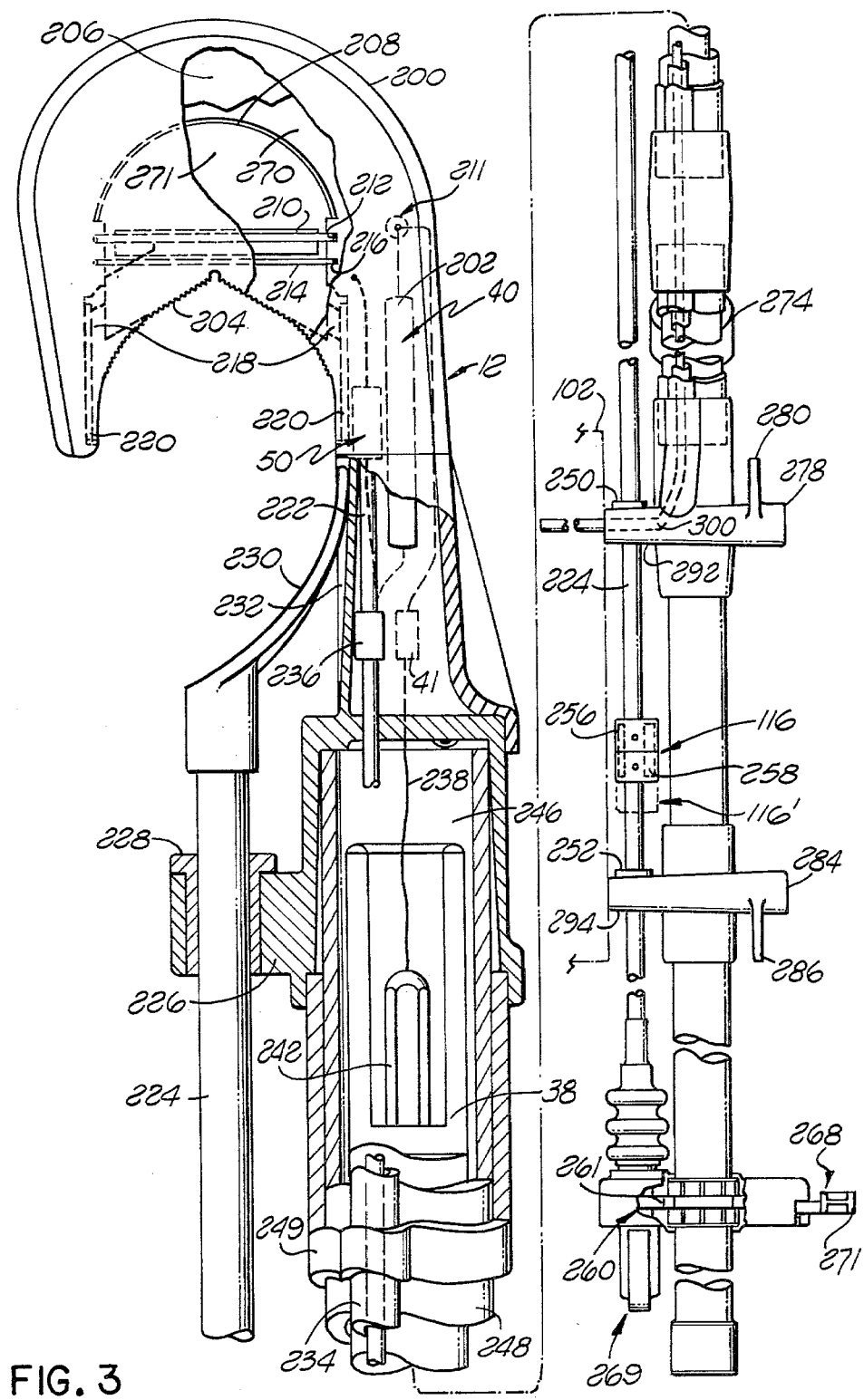
FIG. 3 is a partially cut-away side view of the current probe assembly incorporating a Hall head current sensor device and with the enclosure assembly and interconnecting cable being omitted.
Figure 4:
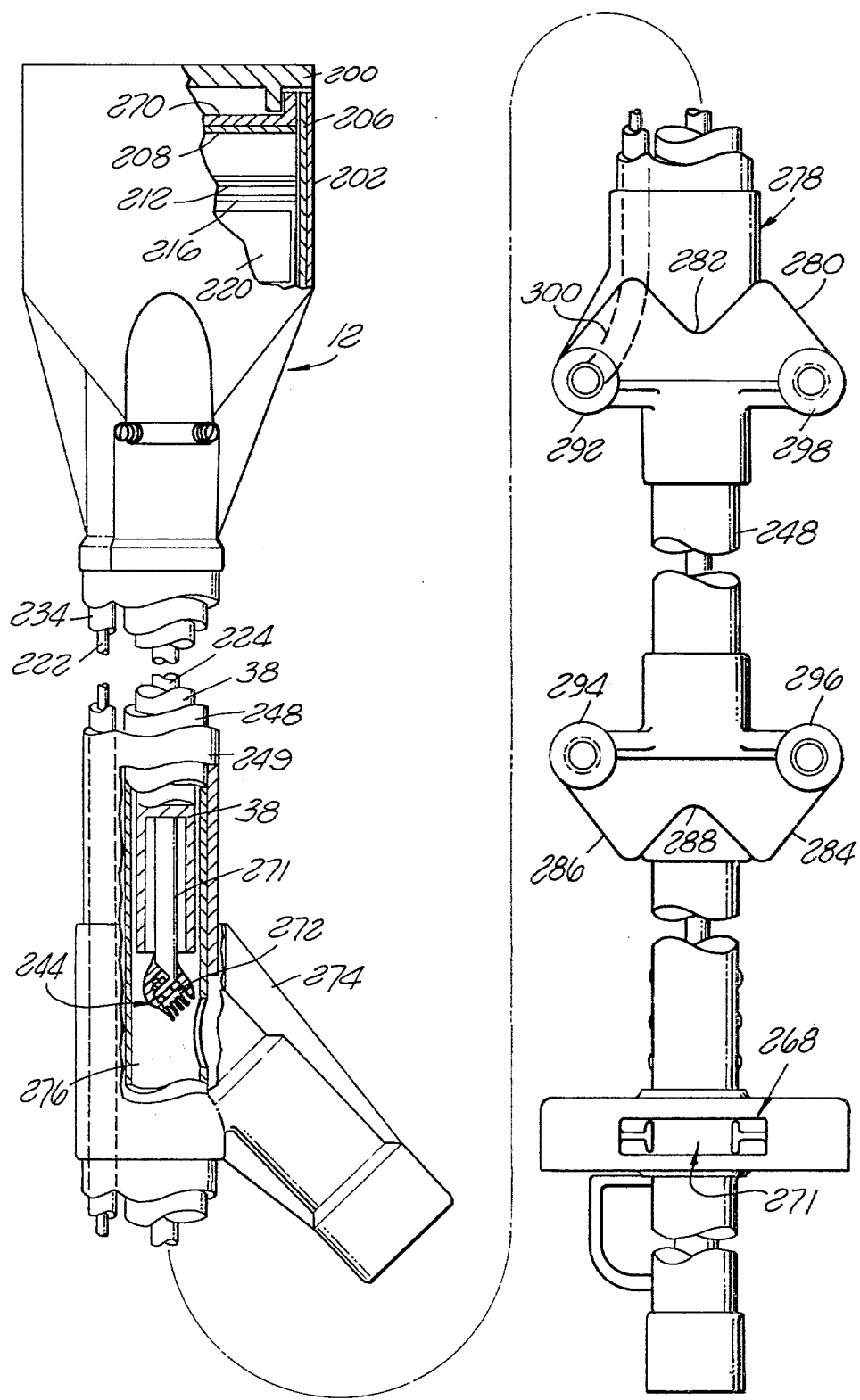
FIG. 4 is a rear, partially cut-away, view of the current probe assembly having a Hall head sensor device and with the enclosure assembly and interconnecting cable being omitted.

Referring to FIGS. 3 and 4 a detail of the current probe assembly is illustrated having a Hall head assembly comprising a sensing head mount member 270, which is positioned inside a sensing head cover 200.

Both the mount member 270 and the cover 200 are made from a non-conductive material such as plastic. For example, the cover 200 and the mount member 270 may be made of acrytonitrile-butadiene-styrene (ABS) compound which has high dielectric breakdown, high impact resistance, moderate weight, resistance to hydrocarbons and good resistance to ultraviolet radiation as a function of color.

The sensing head mount member 270 defines an interior chamber 271 in which various devices, components and circuitry are placed. This chamber 271 is shielded from the magnetic field surrounding the reference conductor by providing a peripheral shield 208 about the dome or upper portion of the chamber 271. In addition, a shield board 214 is positioned in a shield board slot 216 between the reference conductor and the chamber 271.

A Hall board 210 containing various components of the Hall sensor device and circuitry is positioned in a Hall board slot 212 provided in the sensing head mount member 270. The Hall board 210 is thus positioned in the chamber 271 between the peripheral shield 208 and the shield board 214. In the preferred embodiment, the peripheral shield 208 and the shield board 214 are made of a high permeability nickel iron alloy which shield the interior of the chamber 271 from the magnetic field which exists about the reference conductor and neighboring conductors.

A conductive side plate 202 is attached to the sides of the mount member 270 for making electrical contact with the reference conductor. In the preferred embodiment, contact teeth 204 are provided along the inside edge of the side plate to facilitate making electrical contact. A conductive gasket 206 which may, for example, be made of silicone rubber impregnated with silver granules, is positioned between the conductive side plate 202 and the sensing head mount member 270 and is in electrical contact with the peripheral shield 208, the Hall board 210 and the shield board 214. Thus, all electrically conductive components are at the reference potential. This is a preferred interconnection to prevent the build-up of electrical potentials between elements components which may be destructive to the electronic components.

A specific Hall sensor device and associated circuitry which may be used in the phase angle meter instruments is described in co-pending application, Ser. No. 042,670, filed May 25, 1979, entitled "HALL HEAD SENSOR ASSEMBLY AND CIRCUITRY," which application disclosure is incorporated herein by reference. Concentrator plates 220 and concentrator rods 218, as described in that application, are positioned adjacent to the sensing head mounting member 270 on opposite sides of the reference conductor to thereby concentrate the circumferential magnetic field of the reference conductor onto a Hall sensor (not shown).

The sensing head mounting member 270 and the sensing head cover 200 are affixed to a current probe pole 248 which is covered by an insulative guard 249. The current probe pole 248, the sensing head 270 and sensing head cover 200 may be made of different plastic compounds and may be attached together with epoxy or other suitable adhesives.

A control rod 224 is movably attached to the current probe using a bushing 228 which is inserted in an orifice in a current probe mounting flange 226. The bushing 228 allows the control rod 224 to be rotated and moved longitudinally relative to the current probe pole 248.

A locking blade 230 is attached to the end of the control rod 224 so that the accidental dropping of the instrument from an overhead conductor is prevented. The end of the locking blade 230 is positioned to recess into a groove 232 molded into the sensing head member 270.

The second capacitor 38 is physically positioned inside of the current probe pole 248. The upper end of the capacitor 38 has a central hollow portion in which an upper connecting stud 242 is disposed. In the preferred embodiment, the capacitor 38 is a high voltage capacitor having a capacitance of about 0.001 microfarads.

A voltage sensor wire 238 is coupled to the end of the upper connecting stud 242 and extends from this upper connecting stud into a space between the sensing head 270 and the sensing head cover 200. The voltage sensor wire 238 is there spliced onto one terminal of a high voltage resistor 41. The other terminal of resistor 41 is serially connected to one terminal of high voltage resistor 40 via a hole 211 in the center rib of sensing head 270. The other terminal of resistor 40 is then joined to one terminal of bipolar zener diode 50 and to a bundle of cables 222 at the splice 236. The other terminal of bipolar zener diode 50, is electrically and mechanically joined to side plate 202. The wires which comprise the bundle of cables 222 above the splice 236 are the reference ground lead 14 coupled between the conductive side plate 202 and the various circuits and components in the enclosure 22 (FIG. 1); the current signal lead coupled between the Hall board 210 and the current comparator circuit 24 (FIG. 1); control leads for the circuits on the Hall board 210; and the and the power supply leads coupled between the power supply 48 (FIG. 1) and the Hall board 210. The additional lead connecting the resistor 40 to the voltage input circuit 44 (FIG. 1) is bundled into the cable 222 below the splice 236.

In the preferred embodiment, an additional insulating tube 234 surrounds the cable 222 in the region closer to the operator. The cable 222 within the insulating tube 234 passes along the length of the current probe pole 248 passing through a sensor cable passageway 300 formed in the upper attachment yoke 278. The passageway terminates in the interior of the enclosure assembly (not shown).

Referring to FIG. 4, the lower end of the capacitor 38 is provided with a hollow cavity in which a lower connecting stud 271 is disposed. The lower connecting stud extends beyond the end of the capacitor 38 and has attached thereto a connector clip 272 to which the high voltage cable 110, shown in FIG. 2, is attached. A high voltage cable fitting 274 is provided to insulate the high voltage cable from the operator.

In the preferred embodiment, the hollow region between the capacitor and the interior of the current probe pole 248 is filled with an insulative material, such as silicone rubber compound 246 (FIG. 3) and 276. In addition, the sharp edges and corners of the connecting stud 271 and the connector clip 272 are covered with a semiconductor compound 244 in a smooth, rounded configuration to prevent corona discharge.

An upper attachment yoke 278 and a lower attachment yoke 284 are affixed to the current probe pole 248 by epoxy or the like to provide a means by which the potential probe and the current probe may be mechanically and removably coupled together. The upper attachment yoke 278 and the lower attachment yoke 284 are molded from a non-conductive plastic compound. The upper attachment yoke 278 has an upper attachment flange 280 with a central upper attachment notch 282 therein. In a similar manner, the lower attachment yoke 284 is provided with a lower attachment flange 286 having a downwardly opening lower attachment notch 288.

As shown in FIG. 4, attachment studs 292, 294, 296 and 298 extend from the upper and lower attachment yokes on the side of the current probe pole 248 opposite from the upper attachment flange 280 and lower attachment flange 286. The enclosure assembly 102 to be described hereafter is then attached to the respective enclosure assembly attachment studs with epoxy or the like.

Referring to FIG. 3, the control rod 224 is held in place by bushing 250 attached to the upper attachment yoke 278 and by a bushing 252 which is attached to the lower attachment yoke 284. The magnet assembly 116 is attached to the control rod 224 at a central location between the bushing 250 and the bushing 252. As previously described, the circuitry in the interior of the enclosure assembly 102 is turned ON or OFF by means of magnetic switches located inside the instrument enclosure assembly 102. The magnetic switches are activated by the magnet assembly 116. The magnet assembly 116 has a bar magnet 258 attached to one side of the control rod 224 and a high permeability magnetic shield 256 to the other side so that the bar magnet 258 and the shield 256 are parallel to each other. The circuitry in the enclosure assembly may be turned ON by rotating the control rod 224 so that the bar magnet 258 comes into magnetic proximity with the magnetic switches within the enclosure assembly 102. The operating mode of the microcomputer can be changed by pulling down on the control rod 224 so that the bar magnet 258 activates other magnetic switches also loacted within the enclosure assembly 102.

In the preferred embodiment, a grip assembly 269 is spring loaded upwardly so that the magnet assembly 116 will normally be in a first position, shown as 116. To change the position of the bar magnet 258 to a second and lower position, shown as 116', the control rod is pulled downwardly and held in place to thereby change the mode of operation. When the control rod is released, the control rod and hence the bar magnet, will return to the first position under the force of a spring (not shown).

To provide a safety mechanism, a lockout yoke assembly 268 is provided to cooperate with a detent cam 260 causing the detent cam 260 to rotate with the control rod 224. The detent cam in one embodiment is in engagement with a roller 261. The roller 261 is attached to the lockout yoke assembly 268 which, on its opposite extremity, provides a saddle 271 for the potential probe. The position of the lockout yoke assembly 268 is therefore controlled by the cam 260 where the position of the cam 260 is a function of the angular position of the control rod 224.

In operation, when the potential probe is removed from its perch on the current probe, the lockout yoke assembly 268 travels out to a position under the force of a spring (not shown). This brings the roller 261 out of contact with the cam 260 and allows the instrument to be turned ON since the control rod and its associated parts can now be rotated 180°. When the instrument is turned on, the lockout yoke assembly 268 is locked in its extended position by the action of the cam 260 and the roller 261 making it impossible to replace the potential probe. If the instrument is turned OFF, the lockout yoke assembly 268 will be free to retract with no interference.

In one embodiment, the cam may be configured so that, if the instrument is left on and force is applied to replace the potential probe, the geometry of the cam will cause the control rod to automatically rotate, thus turning the instrument OFF automatically. Of course, it will be appreciated that any other appropriate safety mechanism may be utilized which will prevent replacement of the potential probe ON its perch on the current probe with the electronic circuitry left ON.

The sensing head 104 shown in FIG. 2 may be a current transformer sensor device rather than a Hall sensor device. An illustrative embodiment of a current transformer sensor device is shown in FIGS. 5, 6, 7 and 8.

Figure 5:
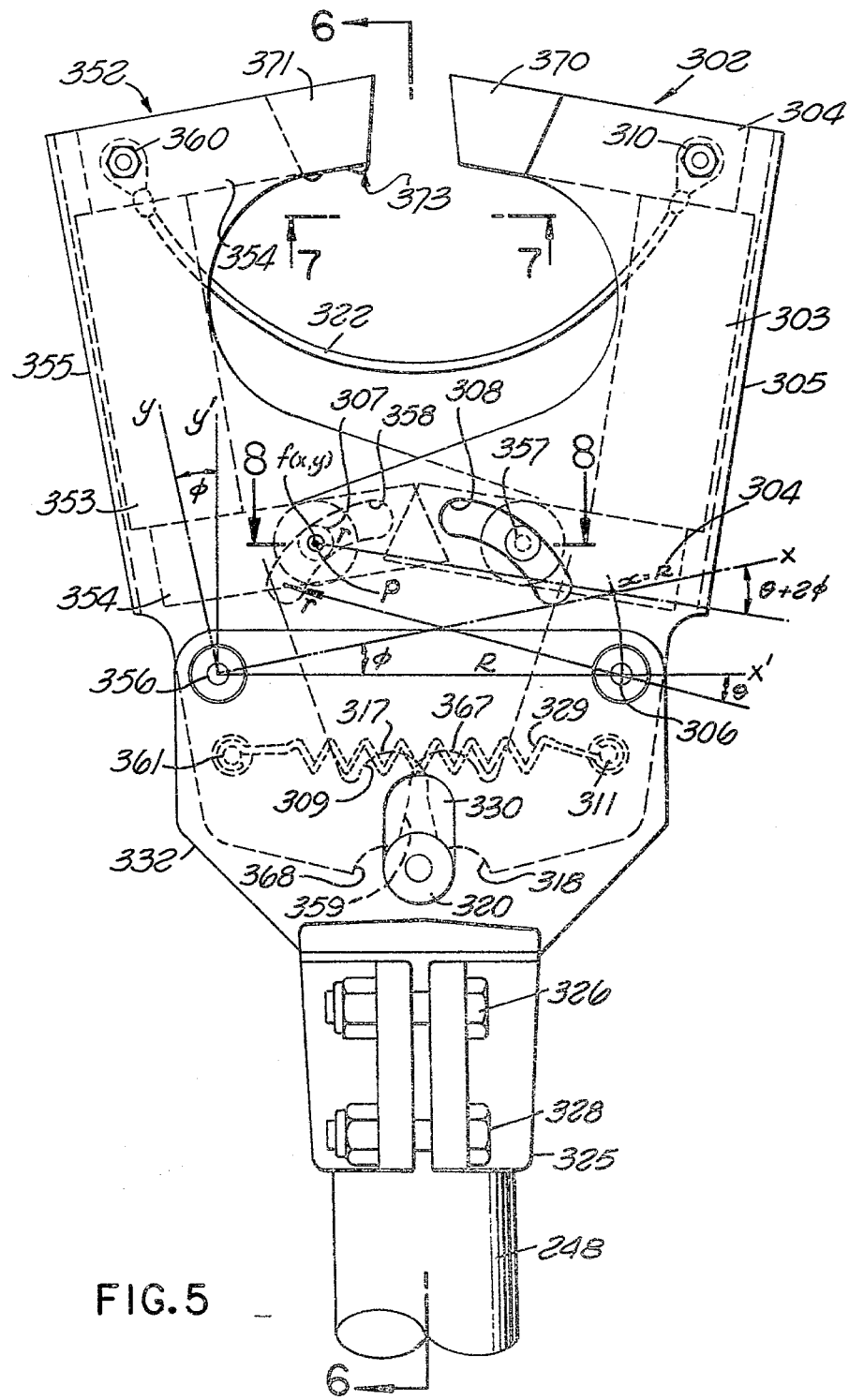
FIG. 5 is a front view of the current transformer sensor device in accordance with the second embodiment of the invention.
Figure 6:
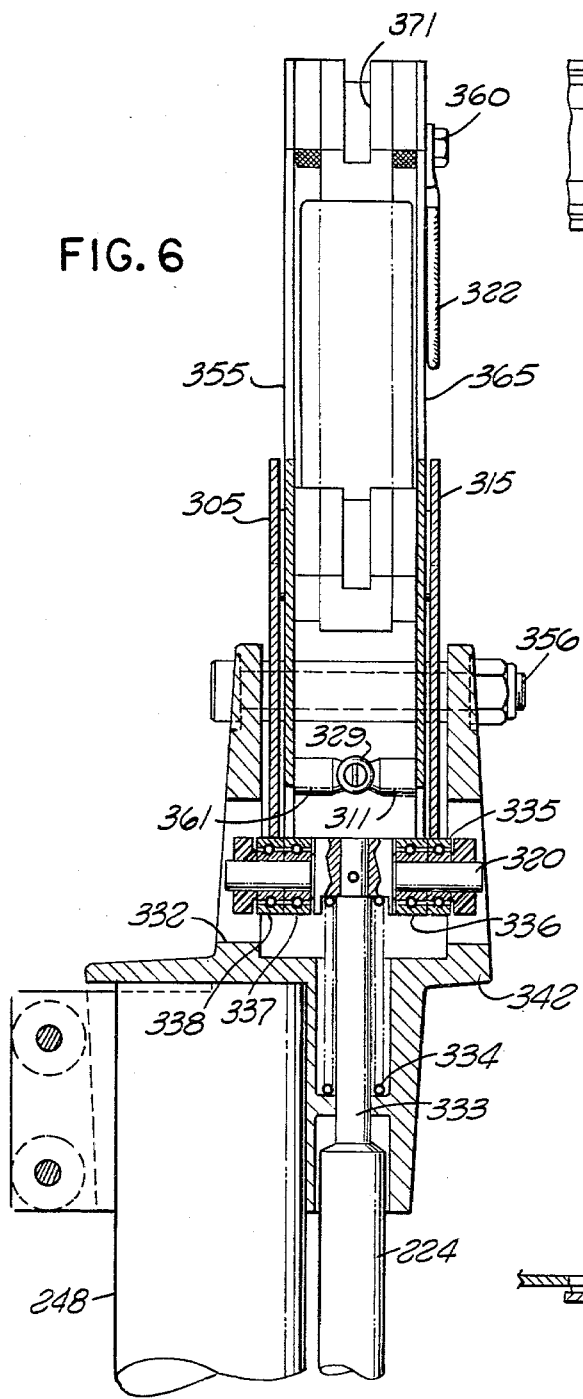
FIG. 6 is a sectional view of the current transformer sensor device of FIG. 5.
Figure 7:
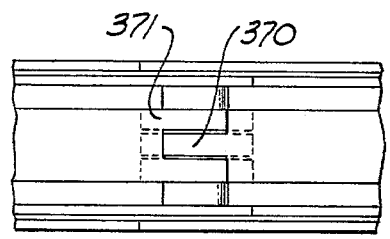
FIG. 7 is a sectional detail of a portion of the current transformer sensor device of FIGS. 5 and 6.

Referring to FIGS. 5 and 6, the current transformer device comprises a right transformer assembly 302 and a left transformer assembly 352 which have substantially the same mechanical configuration except that the right transformer assembly 302 has a male mating end 370 while the left transformer assembly 352 has a female mating end 371. The two mating ends are adapted to interconnect with one another when the right and left transformer assemblies 302 and 352 are rotated into a closed configuration about the reference conductor (FIG. 7).

The right transformer assembly 302 has a right front housing plate 305 and a reciprocal right rear housing plate 315. The right front housing plate 305 has a right guide opening 308 therethrough and an inwardly directed guide pin 307. The housing plate 305 is coupled to and pivots about a right pivot axle 306 which is attached between a front mounting member 332 and a rear mounting member 342 which may be combined as a single U-shaped mounting member.

The front housing plate 305 also has a cam follower surface 309 configured in the lower corner of the housing plate 305 remote from the pivot axle 306. The cam follower surface 309 is positioned against a circular cam 320 which may be moved vertically in a cam guide groove 330 to allow the right and left transformer assemblies 302 and 352 to be opened.

The front and rear housing plates 305 and 315, respectively, define an interior U-shaped chamber in which a right transformer assembly is positioned. Specifically, the right transformer assembly comprises a right coil 303 which is wound about a vertical portion of a right core member 304.

Figure 8:
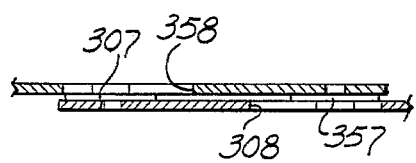
FIG. 8 is a sectional detail of the pin and slot configuration shown in FIG. 5 and useful for simultaneously opening and closing the left and right current transformer halves.

The left transformer assembly 352 is substantially similar to the right transformer assembly 302 and has a left front housing plate 355 and a rear left housing plate 365 which is the reciprocal to the front left housing plate 355. The left front and rear housing plates also form a U-shaped cavity or chamber in which a left transformer coil 353, wound about a vertical portion of a left core member 354, is positioned. The housing plates 355 and 365 are coupled to pivot about a left pivot axle 356. The housing plate 355 has an outwardly extending guide pin 357 positioned to extend through the right guide opening 308 as shown in FIG. 8. The front housing plate 355 also has a guide opening 358 through which the guide pin 307 extends.

The front housing plate 355 also has a cam follower surface 359 which is held adjacent to the surface of the cam 320. In operation, the left transformer assembly 352 is oriented to pivot inside, that is between the front housing plate 305 and the rear housing plate 315.

An opening spring 329 is connected between a right pin 311, which is attached between the front and rear housing plates 305 and 315 and a left pin 361, which is similarly attached between the front and rear housing plates 355 and 365. The pins 311 and 361 are attached to the housing plates at a position below the pivot axles 306 and 356 so that the spring 329 is stretched when the right and left transformer assemblies 302 and 352 are closed. The spring thus tends to hold the left and right transformer assemblies in an opened position rather than a closed position.

In operation, the left and right transformer assemblies 302 and 352 will normally be in an open position to allow the reference cable to pass between the ends of the transformer assemblies 370 and 371, respectively. In the open position, lower circular portions 318 and 368 of the cam follower surfaces 309 and 359, respectively, will rest adjacent to the surface of the cam 320 and the spring 329 will be in its unstretched state. When the transformer assembly is thrust around the reference cable, the reference cable will come in contact with a closure cable 322 attached to the right housing plate by a right closure cable nut 310 and attached to the left housing plate by a left closure cable nut 360. As the reference conductor pushes against the closure cable 322, the left and right transformer assemblies 352 and 302, are pulled together causing the right transformer assembly 302 to pivot about the right pivot axle and the left transformer assembly 352 to pivot about the left pivot axle. This pivoting further causes the cam follower surfaces 309 and 359 to move over the surface of the cam 320 causing the guide pin 357 to move clockwise along the guide opening 308 and the pin 307 to move counterclockwise along the guide opening 358.

The pivoting of the left and right transformer assemblies continues until the male mating end 370 is in the closed position in the female mating end 371. At this point, circular portions 317 and 367 of the cam follower surfaces 309 and 359 will be adjacent to the surface of the cam 320 with the spring 329 in a stretched state. The cam follower surface portions 317 and 367 thereafter hold the left and right transformer assemblies 352 and 302 in the closed position even though the spring 329 is in the stretched state and external forces may be applied to open the current transformer device.

In order to open the jaws it is therefore necessary to move the cam 320 vertically downward to cause it to move away from the cam follower surface portions 317 and 367. Thus, the cam 320 is attached to the end of the control rod 224. The control rod 224 is provided with an end member 333 which extends upward and attaches to a center region of the cam 320. By pulling downward on a control rod 224, the end member 333 pulls the cam 320 downward in a vertical motion. In order to provide an upward pushing force against the cam, an end member spring 334 is provided about the end member 333 which compresses when the cam 320 is pulled down by the control rod 224. To release the closure of the current transformer device, the control rod is merely pulled down thereby releasing the cam from the circular cam follower surfaces 317 and 367 to allow the spring 329 to rotate the left and right transformer jaws 302 and 352 to an open position.

In order to assure that the left and right transformer assemblies 302 and 352 open and close in a symmetrical manner about the centerline of the conductor, the left and right guide openings are shaped along the locus of a line f(x,y) which is defined by the parametric equations:

$$x = R - [R \cos \phi - r \cos (\theta + 2\phi)]$$

$$y = R \sin \phi + r \sin (\theta + 2\phi)$$

where "x" is the horizontal coordinate, "y" is the vertical coordinate perpendicular to the horizontal coordinate and is fixed to extend vertically relative to the left housing plate 355. The x, y coordinate system rotates with the left housing plate 355 through an angle $\phi$ about the left pivot axle 356. The distance between the left pivot axle and the right pivot axle is a constant, indicated by the letter R with the vector r measured from the x=R point on the x axis to the point P, which is the location of the right guide pin 307. Finally, the angle of $\theta + 2\phi$ is defined as the angle between the vector r and the x axis.

In order to facilitate movement of the cam follower, surfaces 309 and 359 along the surface of the cam 320, bearings 335, 336, 337 and 338 are positioned over the surface of the cam. These bearings may for example, be a nylon-type bearing. In the preferred embodiment, ball bearings are utilized.

The current transformer device is attached to the current probe pole 248 utilizing an attachment fitting 325 which may be tightened over the end of the current probe pole 248 utilizing a pair of head attachment bolts 326 and 328. A plate 373 is provided as an attachment point for the reference ground lead 14 (FIG. 1).

A current signal is induced in the serially connected right and left coils 303 and 353, respectively, when the reference conductor is positioned between the right and left transformer assemblies 302 and 352. The alternating current in the reference conductor induces a signal in the coils which is substantially in phase with the current in the reference conductor. This signal may then be further transformed and digitized to form the desired first digitized current signal.

Figure 9:
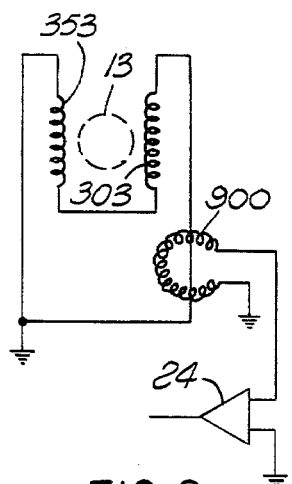
FIG. 9 is an electrical schematic of the current transformer sensor device.

A schematic of the preferred embodiment is illustrated in FIG. 9 wherein a first current signal is derived from the secondary windings 303 and 353 which are coupled in series and positioned on either side of the distribution conductor. The first current signal is transformed again in a toroidal transformer 900 to produce a second current signal which is coupled to the current comparator circuitry 24 in the manner previously described.

Potential Probe Assembly

Figure 10:
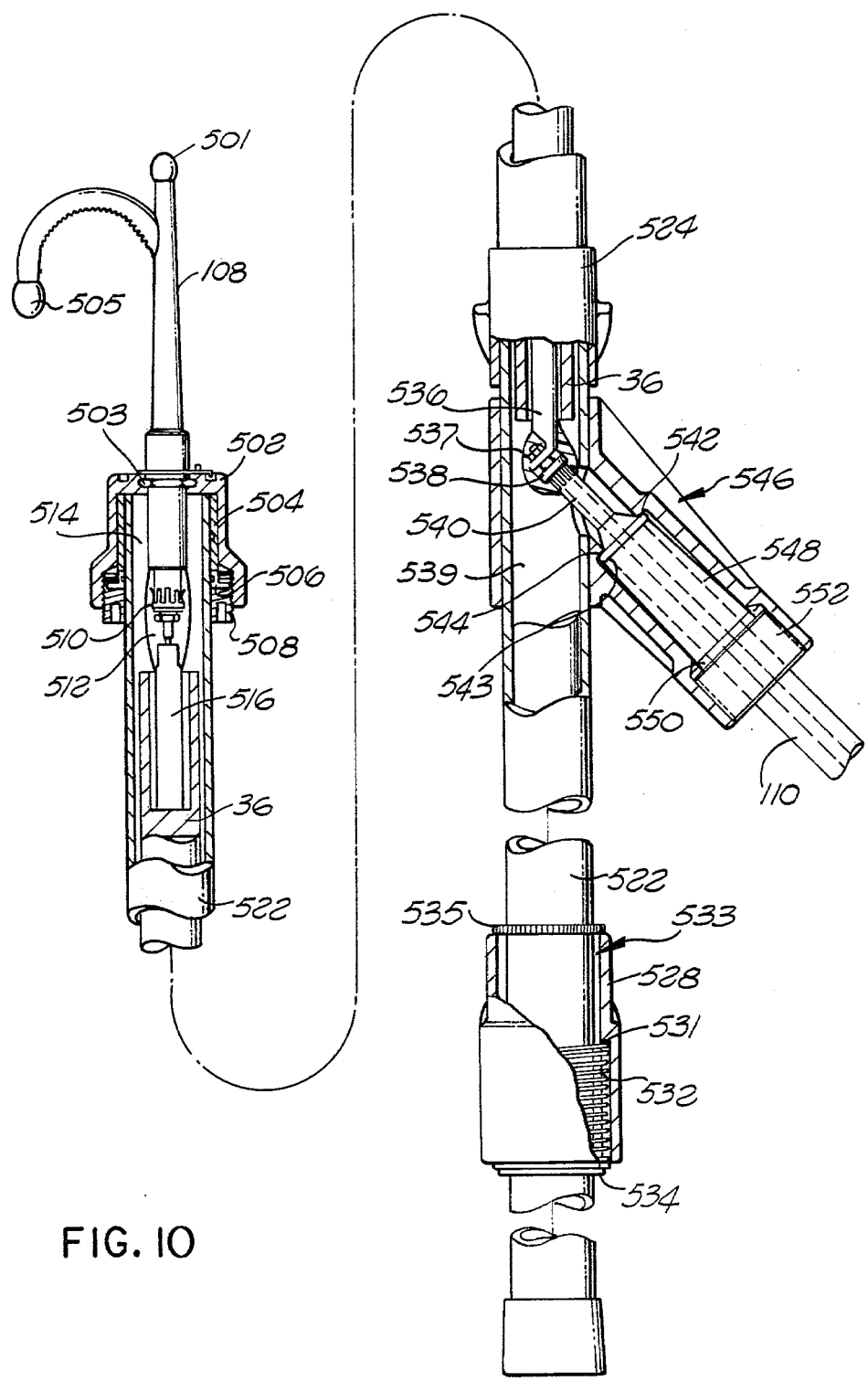
FIG. 10 is a partial cut-away view of the potential probe assembly in accordance with the present invention.

Referring now to FIG. 10, a potential probe in accordance with the present invention is illustrated having a hook apparatus 108 attached to the end of a cylindrical potential probe pole 522. The hook 108 is adapted to be hooked over a conductor such as the first conductor 32 shown in FIG. 1. In the preferred embodiment, corona discharge ball 501 and 505 are attached to the hook 108 for discharging corona which may occur at higher voltages and certain atmospheric conditions.

The phase conductor hook 108 is attached to a potential probe fitting 502 utilizing a threaded fitting 503 which may be embedded in the potential probe fitting 502. The potential probe fitting 502 is preferably a nonconductive material such as plastic. The hook 108 with the discharge balls 501 and 505 may thus be easily interchanged with a different phase conductor hook having, for example, a different physical configuration.

The potential probe fitting 502 may be attached to the potential probe housing 522 utilizing a deformable cylindrical potential probe plug 504 positioned between the cylindrical outside surface of the potential probe pole 522 and the cylindrical inside surface of the potential probe fitting 502. An insulative ring 506, such as a nylon ring, is inserted in position about the end of the plug 504 remote from the hook 108. The potential probe fitting 502 is then provided with an inside threaded region into which a compression screw 508 is screwed to compress the potential probe plug 504. The compression force causes the plug 504 to expand inwardly and outwardly, thus press fitting the fitting 502 to the end of the potential probe pole 522.

As with the current probe assembly, capacitor 36 is positioned within the potential probe pole 522. The capacitor 36 has a hollow upper end into which an upper connecting stud 516 is installed. A connecting clip 510 is attached to the end of the upper connecting stud 516 to make an electrical connection between the phase conductor hook 108 and the upper connecting stud 516.

In order to minimize corona discharge, the connecting clip 510 is covered with a semi-conductor material 512 to thereby eliminate any sharp corners or surfaces along the conductive path. Finally, an insulation compound or material 514 is placed in the hollow region in the interior of the potential probe pole 522 between its interior surface and the outside of the conducting surfaces.

The lower end of the capacitor 36 is similarly provided with a hollow portion into which a lower connecting stud 536 is installed a connecting clip 538, attached to the lower end of the lower connecting stud 536, is adapted to receive a ferrule 540 which is integral with the end of a high voltage cable 110. These components are similarly provided with a semiconductor material 537 and insulating material 539.

The high voltage cable 110 is interconnected to the potential probe pole utilizing a high voltage cable fitting 546 which has an interior shoulder 544 against which a circular lip 543 of a retaining sleeve 542 is positioned. The retaining sleeve 542 and ferrule 540, which may be one integral part, are then provided with an interior hole through which the cable conductor passes and to which the cable conductor is soldered. An insulation plug 548 is positioned in the hole about the outside of the high voltage cable with a washer 550 positioned on top of the plug 548. A compression screw 552 is then provided to screw into an inside threaded portion of the cable fitting 546 to compress the insulation plug 548 and expand against the outside surface of the high voltage cable 110 and the inside surface of the cable fitting 546.

The lip 543 on the retaining sleeve 542 assists in preventing the cable from being pulled outwardly when, for example, the current probe assembly 10 (FIG. 1) should accidentally fall off the reference conductor 13 (FIG. 1).

Referring to FIG. 2A, the potential probe pole 106 is also provided with an upper attachment fitting 524 having a forwardly extending upper attachment button 526 with a head having a diameter somewhat larger than the grip stem diameter. The upper attachment fitting 524 is fixed to the potential probe pole by epoxy or the like.

Referring again to FIG. 10, a lower, spring loaded attachment fitting 528 has a retaining ring 534 fixed about a guide sleeve 533 at a position below the lower attachment fitting 528. A spring 532 is positioned around the guide sleeve 533 and is held in place by the retaining ring 534. The lower attachment fitting is positioned over the spring 532 so that the spring is in an interior cylindrical cavity between the lower attachment fitting 528 and the outside surface of the guide sleeve 533. The lower attachment fitting 528 also has an interior circumferential shoulder 531 against which the uppermost portion of the spring 532 presses. The lower attachment fitting 528 is thereby movable relative to the potential probe pole 522 by simply pulling down on the lower attachment fitting to thereby compress the spring 532 against the shoulder 531. When the operator releases the lower attachment fitting 528, the spring presses the retaining ring 534 and the shoulder 531 apart causing the attachment fitting 528 to return to its uppermost position. An upper retaining ring 535 which is integral with the guide sleeve 533 serves to limit the upward movement of the lower attachment fitting 528.

Referring again to FIG. 2A, a lower attachment button 530 is fixed to the outside surface of the lower attachment fitting 528 coaxially with the upper attachment button 526. The stem of the button 530 also has a larger diameter head.

Referring to FIGS. 3 and 4 in conjunction with FIG. 10, the potential probe assembly may be interconnected to the current probe assembly by merely pulling down on the lower attachment fitting 528 and thereafter positioning the upper attachment button 526 in the upper attachment groove 282 (FIG. 4) and positioning the lower attachment button 530 in the lower attachment groove 228 (FIG. 4) and thereafter releasing the lower attachment fitting 528. The spring 532 then expands moving the lower attachment fitting 528 and the lower attachment button 530 into the lower attachment groove 288. The larger diameter heads of the buttons 526 and 530 are then wedged behind the upper attachment flange 280 (FIG. 3) and the lower attachment flange 286 (FIG. 3), with the stem portion of the upper and lower buttons 526 and 530 being held in the grooves 282 and 288, respectively (FIG. 4).

Enclosure Assembly

Figure 11:
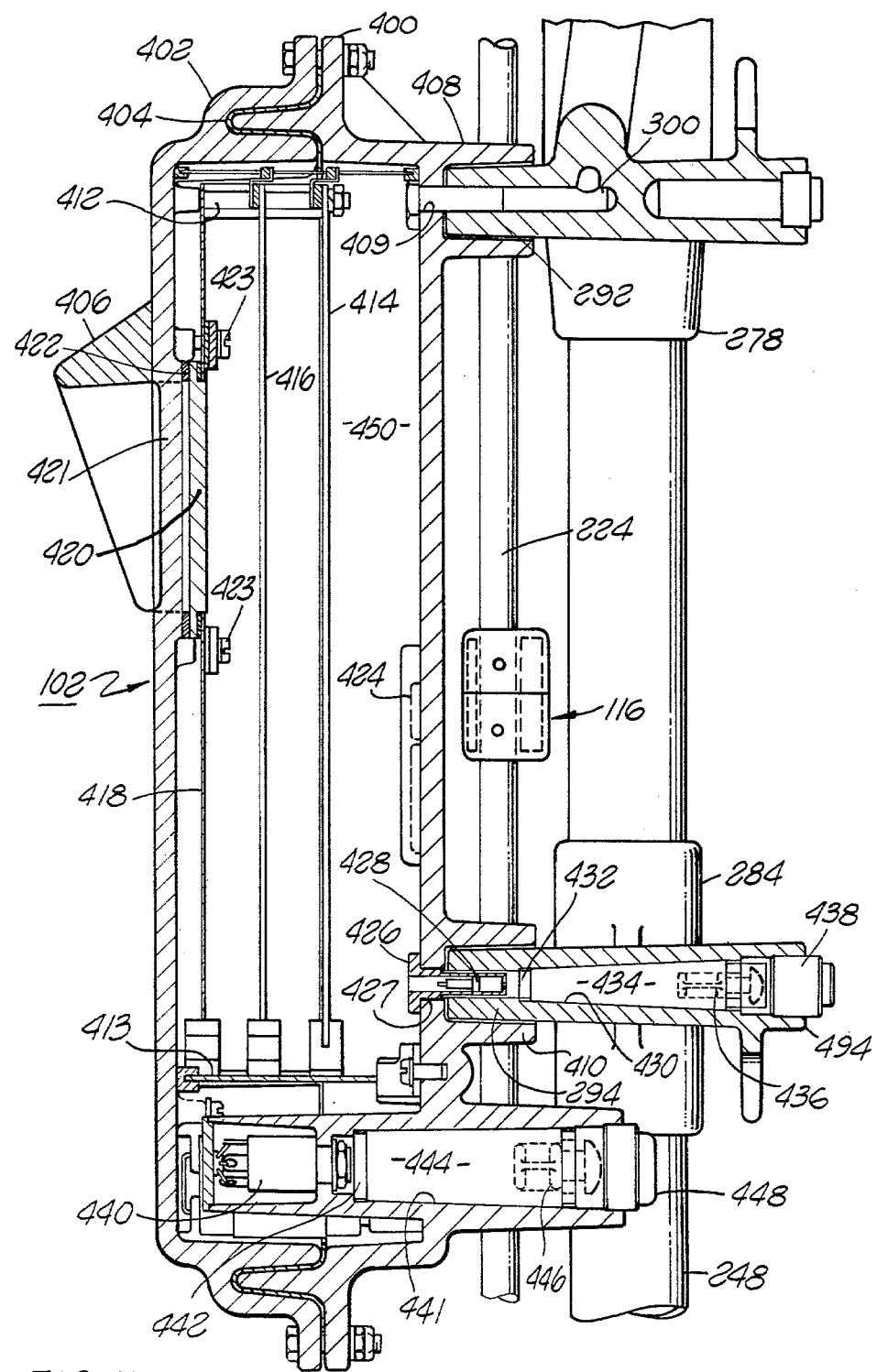
FIG. 11 is a cut-away side view of the enclosure assembly utilized in one embodiment of the invention.

Referring to FIG. 11 the enclosure assembly generally comprises a back enclosure half 400 and a front enclosure half 402 interconnected to the back enclosure half 400 with an enclosure gasket 404 therebetween. The enclosure back 400 is provided with four enclosure stud receptors such as the enclosure stud receptors 408 and 410 which are configured to fit over and be epoxied to the attachment studs 292 and 294, respectively. The enclosure assembly is thereby permanently affixed to the current probe pole 248 via the upper attachment yoke 278 and the lower attachment yoke 284.

The specific configuration of the gasket 404 between the enclosure back 400 and the enclosure front 402 is described in my copending application Ser. No. 042,670, filed May 25, 1979.

Circuit board mounts 412 and another board 413 are attached to the interior of the enclosure assembly to hold an input circuit board 414, a logic circuit board 416 and a display circuit board 418 in a generally parallel spaced relationship. The electronics for the power supply 48, the current comparator circuit 24, the voltage input circuit 44, the microcomputer 26, and the display 28 (FIG. 1) and related and auxiliary circuits and components are positioned on the circuit boards 414, 416 and 418.

A liquid crystal display 420 is electrically coupled to the display circuit board 418 and is physically positioned in the interior of the enclosure assembly behind a clear region 421 integral with the enclosure front 402.

A bezel 406, preferably of a resilient elastomeric material, attached to the enclosure front 402, is provided to shield the clear region 421 from stray light.

The liquid crystal display 420 is clamped by screws 423 to the enclosure front 402 with a liquid crystal gasket 422 positioned between the liquid crystal display 420 and the enclosure front 402.

In the preferred embodiment, the cables 222 (FIG. 3) are passed into the interior of the enclosure assembly via the sensor cable passageway 300 through the center of the attachment stud 292. A hole 409 is then provided through the enclosure back 400 at the bottom of the enclosure stud receptor 408 for passage of the cables 222 (FIG. 3).

In order to permit use of the instrument under widely varied atmospheric conditions, the interior of the enclosure assembly is filled with dry (moisture free) nitrogen 450 by passing nitrogen into the interior of the enclosure assembly via an opening 427 in the bottom of the enclosure stud receptor 410 and exhausting the air, which the dry nitrogen 450 displaces, through a second similar opening in the enclosure stud receptor (not shown), which mates with stud 298 (FIG. 4).

In one embodiment a valve bushing 426 may be placed in the opening 427 with a valve 428 positioned in the valve bushing 426. An appropriate fitting may then be connected to the stud 294 to allow dry nitrogen to enter the interior of the enclosure assembly. A similar valve arrangement may be provided at the exit opening (not shown) to prevent air from again entering the interior of the enclosure when the nitrogen fitting is removed from the stud.

Once the dry nitrogen 450 is in the interior of the enclosure assembly, the hollow portions of the attachment yokes, such as the gas port 430, are electrically sealed to prevent conduction between the interior of the enclosure assembly and the exterior of the enclosure. The insulating seal is provided by utilizing a disc, a plug, a plug pull and a compression screw assembly. Referring by way of illustration to the gas port 430, a generally rigid disc 432 is first placed in the bottom of the hollow portion 430 to provide a solid surface against which an insulation plug 434 can press. The insulation plug 434 preferrably has a plug pull apparatus 436 which has one end embedded in the insulation plug 434 with its opposite end having a head which is grasped and held by coupling onto a compression screw 438. In the preferred embodiment the insulation plug 434 is a non-conducting deformable material such as a resilient silicon material. The particular configuration of the gas port 430 and the insulation plug 434 to achieve an air entrapment free seal between the sides of the hollow portion and the surface of the plug is disclosed in my co-pending application Ser. No. 042,670, filed May 25, 1979 which is incorporated herein by reference.

Utilizing the sealing apparatus disclosed in that application, the compression screw 438 is screwed into an inside thread 494 of the attachment stud 294. As the compression screw 438 is tightened the insulation plug 434 is compressed causing it to deform outwardly against the side walls of the gas port 430 in a progressive manner to exhaust the air bubbles which may exist between the surface of the insulation plug 434 and the surface of the port 430.

When the compression screw 438 is loosened the plug pull 436 pulls the insulation plug 434 from the gas port 430.

The enclosure assembly may also be provided with a battery charging port 441 in the bottom of which is mounted an electrical battery charging connector 440 which provides a point of connection to an external power source to recharge the batteries in the interior of the enclosure assembly.

The electrically insulative closure of the battery-charging port 441 is accomplished in a manner similar to that previously described for the gas port 430. Thus, the battery-charging port 441 has a downwardly sloping conical configuration. A generally rigid disc 442 is placed at the bottom of the battery-charging port 441 and an insulation plug 444, with an electrically insulative grease spread on its surface, positioned in the battery-charging port 441. The insulative plug 444 also is provided with a plug pull 446 in the end remote from the end nearest the disc 442. The plug pull 446 then removably interconnects to a compression screw 448 which compresses the insulation plug 444 as it is screwed into an interior thread in the end of the battery-charging port 441.

As previously discussed a magnetic reed switch assembly 424 is attached to the interior surface of the enclosure back 400 opposite the magnet assembly 116. The contacts of the reed switch assembly 424 are interconnected to turn the electronic circuitry ON and OFF or to actuate various mode changes in the operation of the microcomputer.

System Electronics and Processing

Figure 12:
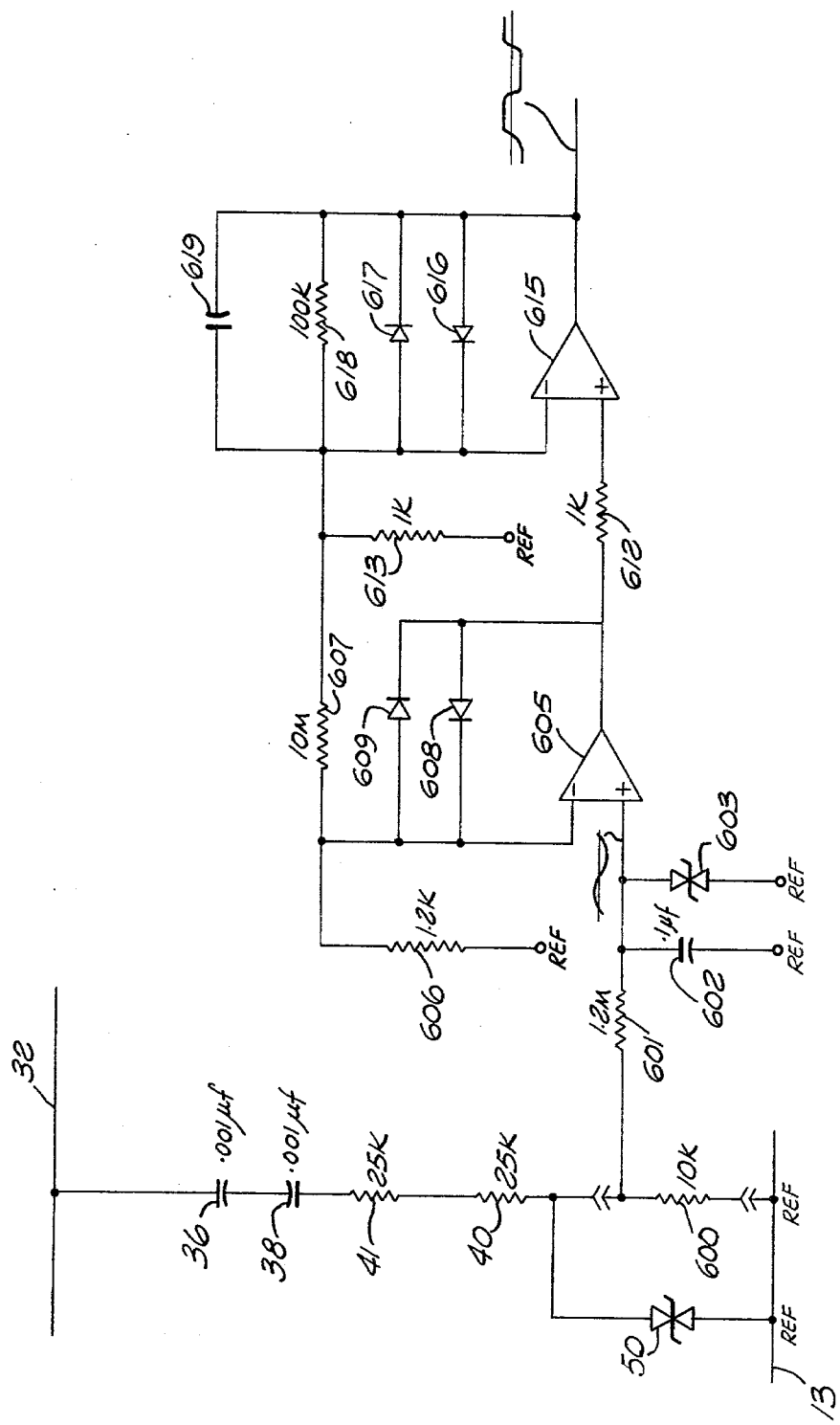
FIG. 12 is a schematic of a voltage signal circuit with an input and output wave form illustrated.

Referring to FIG. 12, circuitry for obtaining the voltage signal is illustrated. In operation, the 0.001 microfarad capacitors 36 and 38 and the resistors 40 and 41, which may for example be 25K resistors, are coupled in series with a 10K resistor 600 in the enclosure assembly between the first conductor 32 and the reference conductor 13. The bipolar zener diode 50 is coupled external to the enclosure assembly, between the reference conductor 13 and the resistor 40 to provide transient protection to the voltage input circuit as previously discussed.

In the interior of the enclosure, the resistor 601, for example 1.2 megaohms, in cooperation with a capacitor 602, for example 0.1 microfarad, constitute a filter network. This filter network has essentially similar and opposite characteristics to the network composed of the capacitors 36 and 38 in cooperation with the resistors 40, 41 and 600. Therefore the filtered signal at the non-inverting input to operational amplifier 605 is substantially in phase with the signal in conductor 32. The bipolar zener diode 603 affords further transient protection.

In order to provide a clipped sine wave signal at the output of the operational amplifier 605, clipping diodes 608 and 609 are placed in parallel, one forward biased and the other reversed biased, between the output and the inverting input of the operational amplifier 605.

The output lead from the operational amplifier 605 is coupled through an input impedance matching resistor 612 to the non-inverting input of a second operational amplifier 615. In the preferred embodiment, the operational amplifier 605 is a high impedance input operational amplifier while the operational amplifier 615 is a high slew rate operational amplifier. Clipping diodes 616 and 617 are coupled in parallel between the output and the inverting input of the operational amplifier 615 with one clipping diode being reverse biased and the other being forward biased.

In order to improve the feedback signal and prevent oscillations, a capacitor 619 is provided in parallel with the diode 616 and 617. The desired amplifier gain for the two stage operational amplifier network is provided by modified "T" feedback resistance network composed of resistors 606, 607, 613 and 618. Specifically, resistor 618 may be a 100K resistor coupled between the output and the inverting input of the operational amplifier 615; the resistor 613 may be a 1K resistor coupled between the inverting input of the operational amplifier 615 and the reference potential base and the resistor 607 may be a 1M resistor coupled between the inverting input of the operational amplifier 615 and the inverting input of the operational amplifier 605. Finally a voltage dividing the resistor 606 may be a 1.2K resistor and it is also coupled between the reference potential base and the inverting input of the operational amplifier 605.

The resultant circuit is a two stage operational amplifier with a high impedance input and a high slew rate output. Such circuits are generally known in the art and are useful in converting a sine wave input, such as the voltage sine wave illustrated at the non-inverting input to operation amplifier 605 to a voltage signal which has a clipped sine wave form as illustrated at the output.

Figure 13:
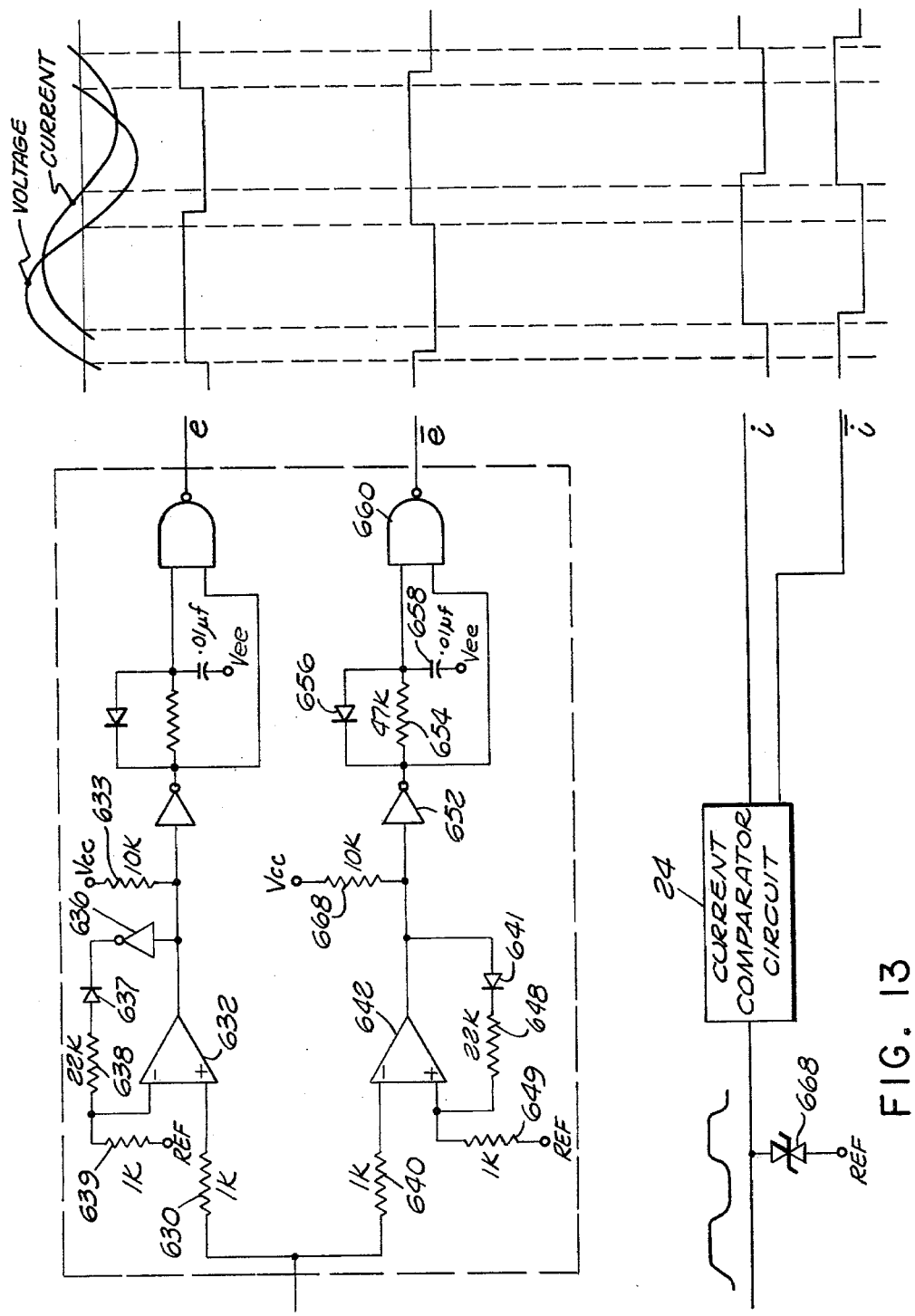
FIG. 13 is a simplified circuit schematic and wave form diagram illustrating the first stage of the digitization of the current and voltage signals.

The voltage signal at the output of the operational amplifier 615 is then coupled to the circuit shown in FIG. 13 which comprises two comparing circuits; one for generating a first digitized leading edge voltage signal having an accurate high going leading edge which occurs on each positive going zero voltage crossing of the voltage signal and a first digitized trailing edge voltage signal having an accurate high going leading edge which occurs on each negative going zero crossing of the voltage signal. In digitizing these signals a high voltage level (Vcc) and a low voltage level (Vee) are established. These voltage levels, which are provided by the power supply 48 (FIG. 1) are substantially symmetrically disposed about the reference potential base level, which is the level of conductor 13 (FIG. 1). In the context of this description, a high voltage level ($V_{cc}$) shall mean logic one and a low voltage level ($V_{ee}$) shall mean logic zero (i.e. positive logic).

Referring specifically to FIG. 13 the signal from the voltage input circuit of FIG. 12 is coupled to the inverting input of a comparator circuit 642 through a resistor 640. A forward biased diode 641 and a resistor 648 are coupled in series between the output and the non-inverting input of the comparator 642. A resistor 649 is also coupled between the reference potential and the non-inverting input of the comparator 642. The resistors 648 and 649 provide a voltage dividing network in a positive feedback loop to cause a sharply rising edge on the output signal from the comparator 642. The diode 641 causes the input signal at the non-inverting input of the comparator 642 to return to zero volts rather than remaining at a voltage somewhat above zero.

A pull-up resistor 668 is coupled between the output of the comparator 642 and the voltage source $V_{cc}$ in a conventional manner. The output of the comparator 642 is next inverted in an inverter 652 whose output is interconnected through resistor 654 to one input of a NAND gate 660. A capacitor 658 is also coupled between the reference potential and the one input of the NAND gate with a discharge diode 656 coupled in parallel with resistor 654 to the output of inverter 652 to allow for rapid discharge of the capacitor 658 when the output of the inverter 652 goes to $V_{ee}$. The output from the inverter 652 is also coupled directly to a second input of the NAND gate 660.

In operation, the comparator 642, causes a falling edge to occur at its output when there is a positive going zero voltage crossing in the voltage signal input. Similarly, the comparator 642 causes a rising or leading signal edge to occur at its output when there is a negative going zero voltage crossing in the voltage signal input. The voltage divider network comprised of resistors 648 and 649 operate to cause the leading edge to be sharply rising.

The output of comparator 642 is then inverted by inverter 652. When the output of the inverter 652 goes to one, the capacitor 658 begins to charge thereby delaying the rise of voltage at the input of the NAND gate 660. This consequently delays the transition at the output of the NAND gate 660 from a high to low voltage. When the output of the inverter 652 goes from one to zero however, the charge on the capacitor 658 immediately discharges through diode 656. Hence the signal at both inputs to the NAND gate 660 immediately go from one to zero causing the output of the NAND gate to immediately go to one. Thus, a very accurate leading edge logic signal, $\bar{e}$, is generated at the output of the NAND gate 660 when the voltage input signal crosses zero volts in a negative going direction. As illustrated, this leading edge occurs at the negative going zero crossing of the voltage signal whereas the trailing edge is delayed until after the positive going zero crossing of the voltage signal has occurred.

In a similar manner, an accurate leading edge logic, e having an accurate leading edge and a delayed trailing edge is provided by coupling the voltage signal to the non-inverting input of a comparator 632 through a resistor 630. The comparator output is inverted in inverter 636 and then fed back to the inverting input of the comparator 632 through a reverse biased diode 637 and a resistor 638. In all other respects, the various components including the resistors 633, 638 and 639 and the diode 637 are configured to perform the identical function as the resistors 648 and 649, 668 and the diode 641. The remaining circuitry is identical to that previously described except that it operates to form an accurate leading edge, which occurs on the logic signal e upon the occurrence of a positive going zero crossing of the voltage signal whereas the trailing edge is delayed until after the negative going zero crossing of the voltage signal has occurred.

In a similar manner, a circuit 24 generates a logic signal i, providing an accurate leading edge upon the occurrence of a positive going zero crossing of the current signal; and a logic signal ī providing an accurate leading edge upon the occurence of a negative going zero crossing of the current signal. The logic signals e, ē, i and ī, derived in the above manner, are herein referred to as the first digitized voltage and current signals, respectively, and are illustrated opposite the appropriate outputs of FIG. 13. Transient protection is provided by the bipolar zener diode 668.

Of course, it will be appreciated that if a current transformer device is utilized, then the two stage operational amplifier illustrated in FIG. 11 may also be required ahead of the current comparator circuit 24.

Figure 14:
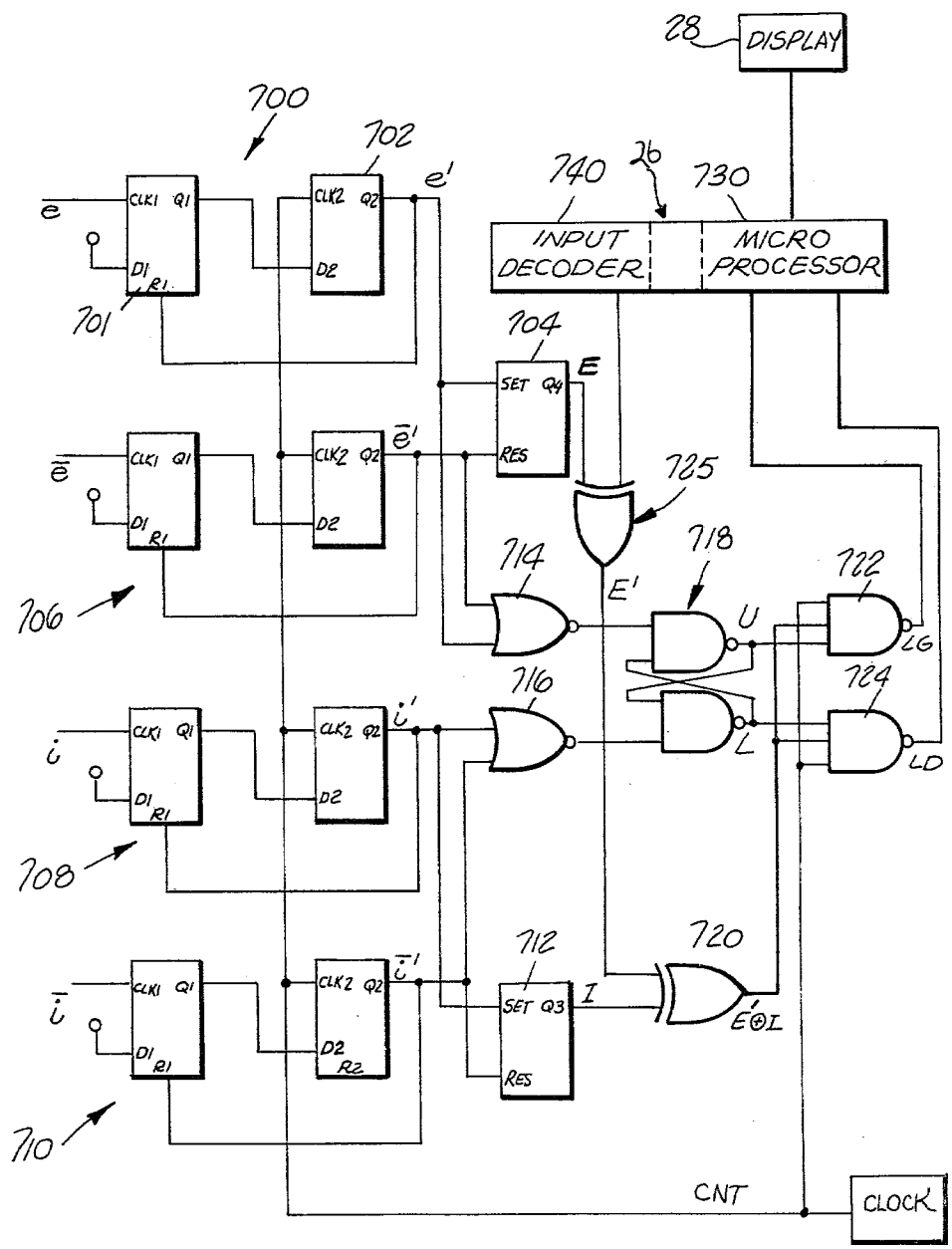
FIG. 14 is a circuit schematic illustrating the generation of the lead and lag pulse trains.
Figure 15:
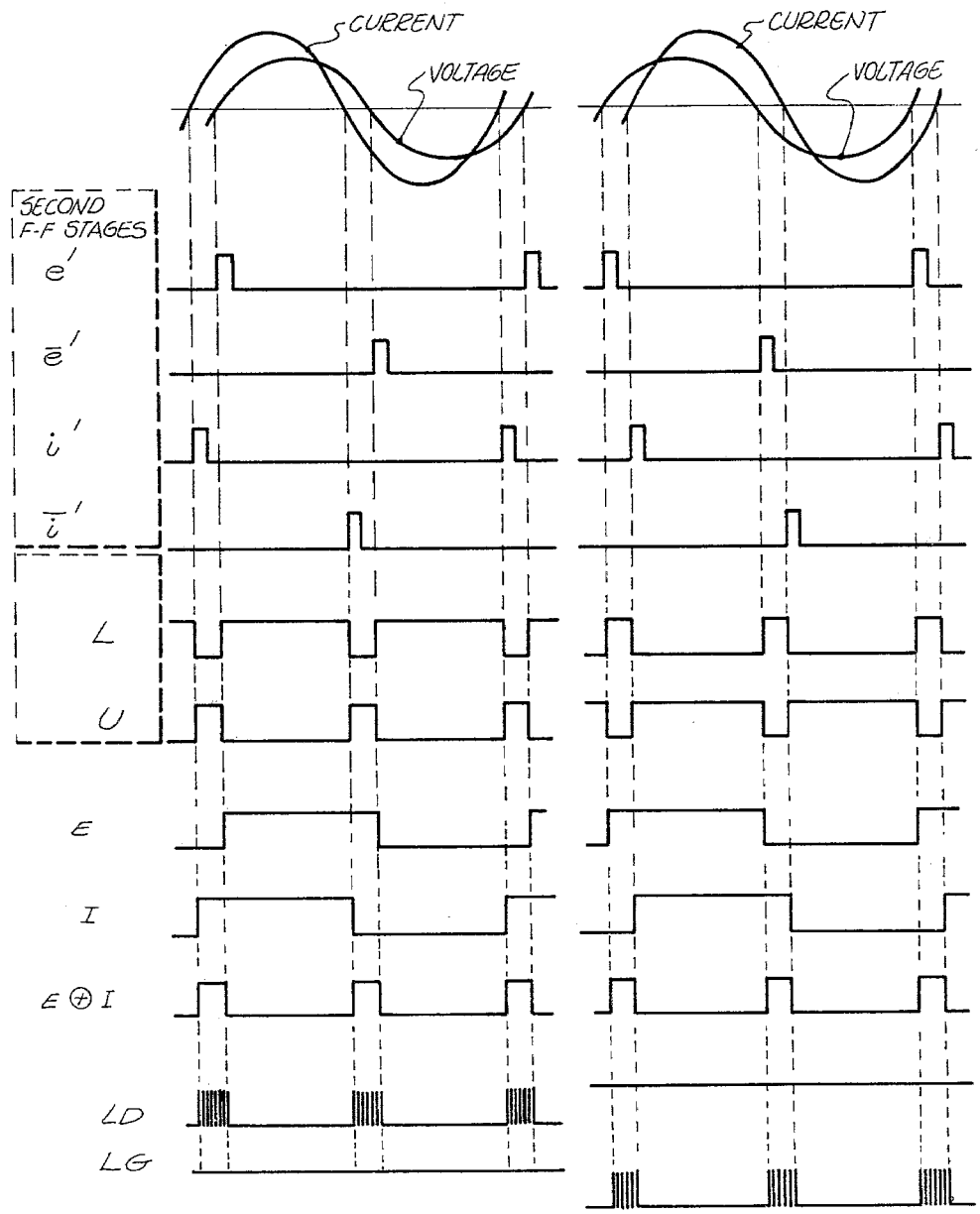
FIG. 15 is a series of waveforms illustrative of the operation of the circuit shown in FIG. 13.

Referring now to FIG. 14, the circuitry shown performs the function of combining the e and ē signals to generate a single digitized voltage signal, E, having accurate rising and falling edges corresponding to the positive going zero crossing and a negative going zero crossing of the voltage signal respectively; and similarly combines the i and ī signals to form a single digitized current signal, I, having accurate rising and falling edges which occur at the positive going zero crossing and the negative going zero crossing of the current signal respectively as is illustrated in FIG. 15.

Additionally, the circuitry shown in FIG. 14, performs the function of synchronizing the digitized voltage signal, E, and the digitized current signal, I, to the signal clock. This clock provides, as part of its function, a signal, CNT, which is used for all counting purposes, as will hereinafter be explained. In order to avoid one bit (i.e. one count pulse) errors whenever the signal, CNT, is being gated ON, or OFF, anywhere in the circuitry, it is desirable to synchronize the signals E and I (and their derivative signals) to the signal, CNT. Since the signal frequency of CNT is high, compared to that of E and I, the gating error is small and predicatable.

Specifically the signal e is coupled to the clock input of a flip flop 701, which is normally in a reset state (i.e. Q1=0). Upon a 0→1 (zero to one) transition of e, Q1 will also transition 0→1. This puts a logic 1 at the data input D2 of flip flop 702. The output Q2 of this flip flop will therefore transition 0→1 on the next clock pulse, CNT. The output Q2 of flip flop 702 is coupled to the reset input R1 of flip flop 701. Therefore a 0→1 transition of Q2 will cause Q1 to transition from 1→0. This now puts a logical 0 on D2 of flip flop 702 and causes Q2 to transition 1→0 on the next clock pulse, CNT. Therefore a synchronized pulse e' of the precise duration of one period of CNT is formed at every leading edge of e and none at any other time.

In a similar manner, a dual flip-flop pulse generating circuit 706 is activated by a high going transition of the ē signal to generate an ē' pulse as illustrated in FIG. 15. The dual flip-flop pulse circuitry 708 and 710 also generate a single pulse signal i' and ī', upon the occurrence of a leading edge in the i and ī input signals respectively (FIG. 15).

The e' signal from the pulse generator circuit 700 is coupled to the set input of a flip-flop 704 and the ē' signal from the pulse generator circuit 706 is coupled to the reset input of the flip-flop 704. The non-inverting output of the flip-flop 704 is thereby set on the synchronized leading edge of the signal ē and is reset on the synchronized leading end of the signal ē' thus generating the signal E which is a digitized voltage signal in phase with the voltage signal and having a leading edge which occurs at the positive going zero transition of the voltage signal and a falling edge which occurs at the negative going zero crossing of the voltage signal.

In a similar fashion the synchronized current signals i' and ī' are coupled to the set and reset inputs, respectively, of a flip-flop 712 to generate a digitized current signal I at the non-inverting output of the flip-flop 712. The digitized current signal has a leading edge which occurs at the positive going zero current transition of the current signal and a trailing edge which occurs at the negative going zero current transition of the current signal (FIG. 15).

It is desired to generate a pulse train, LD during the period that the digitized current signal I and the digitized voltage signal E are not at the same logic levels and the current signal leads the voltage signal and to generate a pulse train, LG, during the period that the digitized voltage signal and the digitized current signals are not at the same logic levels and the voltage signal lags the current signal. These pulse train signals are generated as follows: First, the e' and ē' signals are coupled to the inputs of a NOR gate 714 and i' and ī' signals are coupled to the inputs of a NOR gate 716. The output of NOR gates 714 and 716 are then coupled to the respective inputs of a latch circuit 718 to generate an output signal U which is set to one at each zero crossing of the current signal and is reset to zero at each zero crossing of the voltage signal. Similarly, the latch 718 has a second output L which is essentially the inverse of the output U and therefore resets to zero upon a current signal zero crossing and sets to one upon the voltage signal zero crossing. The resultant signal wave forms for L and U are illustrated in FIG. 15. The signal U generated by the latch 718 is then coupled to one input of a NAND gate 722 and the signal L generated by the latch 718 is coupled to one input of a NAND gate 724.

In order to enable the CNT signal at the proper times, the logic function E'⊕I must be generated. This is accomplished by first gating the signal E from the flip-flop 704 through the exclusive OR gate 725. The function of gate 725 will be explained hereinafter. The output of gate 725 now designated E' and the non-inverting output of the flip-flop 712, on which the signal I appears, are coupled to the inputs of an exclusive OR gate 720 whose output is the desired logic function E exclusive OR I (FIG. 15).

The output of the exclusive OR gate 720 is coupled to one input of the NAND gate 722 and one input of the NAND gate 724. A third input of the NAND gate 722 and a third input of the NAND gate 724 are then coupled to the clock signal CNT.

Thus, the output of the NAND gate 722 will be a pulse train signal LG on which clock pulses occur only when the current signal lags the voltage signal during the time that the digitized voltage signal and the digitized current signal are not at the same logic levels.

Similarly clock pulses will be generated at the output of the NAND gate 724, to form a pulse train signal LD, only during the time that the digitized voltage signal and the digitized current signal are not at the same logic level and the current signal leads the voltage signal.

The gate 725 is controlled by an input decoder 740, which in turn is controlled by the microprocessor 730. Under normal operating conditions the phase angle is always less than ±90°. Under these conditions the input decoder 740 holds the input to gate 725 at zero. Then, the output of that gate will follow the signal E, and E' and E are in phase. Under some operating conditions, which will be explained hereinafter, the phase angle, as computed by the instrument, may be greater than ±90°. When this condition is detected, the microprocessor causes the output decoder 740 to go to a logical one which causes the output of gate 725 to invert the signal E, and E. E and E' will thus be 180° out of phase.

A first register in a microprocessor 730 accumulates a count of clock pulses CTLG which occur during a specified period of time; a second register in the microprocessor 730 accumulates a count of clock pulses CTLD which occur during that same preselected time period; and a third register in the microprocessor 730 accumulates the count of all of the clock pulses CTWI which occur during that same preselected time period.

The microprocessor is then programmed to receive the accumulated counts from the three registers and to calculate an initial phase angle according to the relation:

$$\text{Phase Angle} = 180 \frac{CTLG - CTLD}{CTWI}$$

where CTWI is the total clock pulse count during a predetermined time period in terms of periods of the voltage signal. The preferred number of periods being thirty six.

The microprocessor is also programmed to correct the phase angle computed according to the above relationship by ±30° if phase to phase measurements are taken in a three phase distribution system plus any other appropriate corrective factor. Thus, the relationship becomes:

$$\text{Phase Angle} = 180 \frac{CTLG - CTLD}{CTWI} + K_1 + K_2$$

where $K_1$ can be either 0, +30, or −30. For example, utilizing the Edison 1-3-2 phase rotation, $K_1=0$ when the voltage and current signal is obtained from phase conductors 1, 2 or 3 to neutral; $K_1 = +30°$ when the voltage signal is obtained between phase conductors 1 and 3, and $K_1 = -30°$ when the voltage signal is obtained between phase conductors 1 and 2.

$K_2$ is a second correction constant, which varies from instrument to instrument and is individually programmed into an appropriate memory location in each case. This correction is necessitated by inaccuracies in the geometry of the Hall sensor device, or the current transformer device, and by other inaccuracies, due to component tolerances in the electronic circuitry, as well as capacitive coupling between various components of the instrument and surrounding potentials.

In operation, the instrument would normally be attached to the conductors in such a way that the operator, looking straight into the display would have the feeding bus (the power source) on his left. (Normal polarity) However, in practice, the operator can often approach the desired conductor with the current probe assembly from only one side (e.g., the street side of an overhead distribution line). Thus, it may be impossible for the operator to have the feeding bus on his left. Situations also arise where the location of the feeding bus is uncertain, or unknown. Still other situations arise where, because of physical constraints, the operator must interchange the current and potential probe assemblies and attach them in reverse to the normal manner. All these cases constitute a reverse polarity connection of the instrument.

In the above reverse polarity situations the phase angle would then appear to be greater than ±90°. Referring now to FIG. 15, under such conditions the pulse trains LD or LG, on a per cycle basis, would be more than half a period in duration, during a phase to neutral measurement, or more than two thirds of a period in duration during certain phase to phase measurements.

Therefore, a limit of CTLD or CTLG greater than four fifths of CTWI is established in the microprocessor program, and whenever the pulse count exceeds that limit, the microprocessor causes the input decoder to reverse the signals to gate 725 (FIG. 14), as previously explained. Following that, the count is taken again and the arithmetic is performed as under normal polarity conditions. The resulting angle is the complement of the original angle and is always less than ±90°.

The addition of the constants $K_1$ and $K_2$ can also result in an angle greater than ±90°. When this condition occurs, a similar reversal procedure is initiated by the microprocessor program.

Whenever the complement of an angle is taken by the program, this complement angle is displayed together with the legend REVERSE PHASE. See FIGS. 16 and 2C. This serves to advise the operator that one of the aforementioned reverse polarity conditions exists.

Referring now to FIGS. 15 and 2C, the instrument may be caused to operate in any of nine modes. These are:

1. Power Factor, Phase 1-0
2. Power Factor, Phase 1-2
3. Power Factor, Phase 1-3
4. Phase Angle, Phase 1-0
5. Phase Angle, Phase 1-2
6. Phase Angle, Phase 1-3
7. Phase Angle alternating with Power Factor, Phase 1-0
8. Phase Angle alternating with Power Factor, Phase 1-2
9. Phase Angle alternating with Power Factor, Phase 1-3

Figure 16:
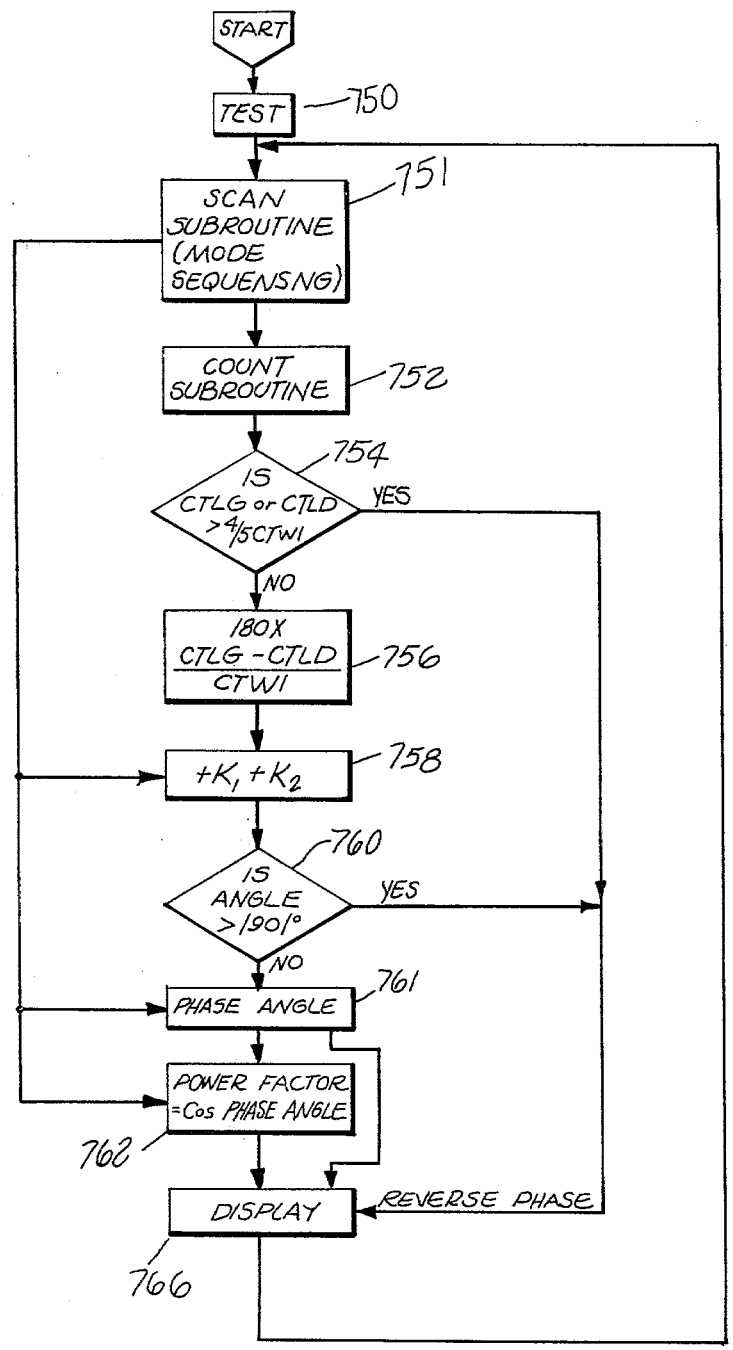
FIG. 16 is a simplified flow chart of the microprocessor program used to compute the phase angle (and power factor) between the voltage signal and the current signal.

Referring now to the flow diagram of FIG. 16, the microprocessor is programmed to execute the following steps:

750 TEST. In this subroutine the microprocessor steps through certain register clearing and testing operations. It also initiates a battery test and a display test which activates the entire display as shown on FIG. 2C. This display is maintained for approximately 5 seconds, after which the microprocessor causes the display to blank and passes to the SCAN subroutine 751.

751 SCAN. In this subroutine the microprocessor scans an input terminal or port, which is connected to the mode selector switch assembly, explained previously. In this mode selector switch assembly is not activated, it remains open and the microprocessor will see a logical one in this input port. Under these conditions the microprocessor will continue to execute the program in the mode used on the previous loop. If the SCAN subroutine 751 was entered from the TEST subroutine 750, the microprocessor will automatically select mode 1.

If the mode selector switch assembly is activated by pulling the control rod 224 (FIG. 3) downwardly the switch closes and the microprocessor will see a logical zero in the input port. Under these conditions, the microprocessor will execute a scanning subroutine which repetitively steps through the operating modes 1 through 9. The microprocessor remains in each mode for approximate 2 seconds during which appropriate legends are displayed (FIG. 2C). When the desired operating mode has been reached, the control rod is released, de-activating the mode selector switch. With the mode selector switch thus opened, the input port now presents a logical one to the microprocessor, which causes it to execute the program in the selected mode.

752 COUNT. This subroutine controls three external counters which are incremented by pulses in the LD, LG and CNT pulse train signals respectively. The microprocessor scans the bit 16 output of each counter and increments an internal register each time the 16th bit is one. Since this bit rate is only one sixteenth as fast as the counting rate, even a relatively slow microprocessor can scan the three registers in succession rapidly enough to read the appropriate outputs on each pass. At each pass, the microprocessor, at another one of its input ports, also scans a signal, derived from E', and increments an internal counting register each time a logic level of one is present. After the counting register has reached a predetermined number (35 in the preferred embodiment), the microprocessor, via an output port, sets an external flip flop. On the rising edge of the 36th cycle the flip flop is reset and the pulse trains LD, LG and CNT are terminated and counting stops.

After this, the microprocessor multiplies each of the counts accumulated in the three registers (CTLD, CTLG and CTWI) by sixteen and stores the results. Then, the microprocessor reads the remaining counts on each of the three counters, via a data bus and input ports. These remainders are added to the appropriate stored results and these sums now constitute the accurate counts CTLD, CTLG and CTWI.

754 In this block the logic decision "IS CTLD or CTLG>4/5 CTWI" is made and the appropriate signals generated.

756 In this block the initial phase angle is computed. In the numerator CTLD and CTLG are algebraically summed to provide greater accuracy near 0° where the phase angle drifts, and may be in a slightly leading position during some cycles, and in a slightly lagging position during other cycles.

758 In this block both constants $K_1$ and $K_2$ are algebraically added to the phase angle, resulting in a final phase angle.

760 In this block a second logic decision is made and appropriate signals are generated if the absolute value of the final phase angle exceeds 90°.

761 In this block the final phase angle is stored. Depending on the program mode, it either passes on to the display 766, or it is used internally to compute the power factor in block 762.

762 In this block the power factor is computed by taking the cosine of the phase angle.

766 In this block all the appropriate legends are generated and combined with the values for phase angle and/or power factor as previously obtained in blocks 761 and 762. The display is updated every 5 seconds by branching back to SCAN 751. At this point also a battery status test is made and displayed on the next program loop.

It will of course be appreciated that various other changes in form and details may be made without departing from the spirit and scope of the invention.

What is claimed is:

1. A portable sensor instrument for interconnection between a first conductor and a reference conductor comprising:
   a potential probe comprising:
     first contact means for making electrical contact with the first conductor, and
     a first capacitor;
   a current probe comprising:
     a sensing head having a second contact means for making electrical contact with the reference conductor and a current sensing assembly for generating a current signal which is substantially in phase with the current in the reference conductor, and
     a second capacitor;
   a cable for interconnecting the first capacitor and the second capacitor;
   an impedance means, the first contact means, the first and second capacitors, the impedance means and the second contact means interconnected in series for generating a voltage signal across the impedance means which is substantially in phase with the voltage between the first conductor and the reference conductor; and
   processing means coupled for receiving the current signal and the voltage signal, comprising:
     means for digitizing the current signal and the voltage signal,
     means for combining the digitized current signal and the digitized voltage signal and generating therefrom a measure of the phase difference between the current signal and the voltage signal, and
     means for displaying the measure of the phase difference.

2. The portable sensor instrument of claim 1 wherein the current sensing assembly comprises a current transformer device having at least one coil and core for being positioned adjacent to the reference conductor, the current signal being generated by the current induced in the coil and core in response to current in the reference conductor.

3. The portable sensor instrument of claims 1 or 2 wherein the first and second capacitors are high voltage capacitors.

4. The portable sensor instrument of claims 1 or 2 wherein the first and second capacitors have a capacitance of about 0.001 microfarads.

5. The portable sensor instrument of claim 1 or 2 wherein the digitizing means further comprises:
   first comparator means responsive to positive going zero voltage crossings of the voltage signal for generating rising edges on a voltage leading edge signal;
   second comparator means responsive to negative going zero voltage crossings of the voltage signal for generating rising edges on a voltage trailing edge signal;
   third comparator means responsive to positive going zero voltage crossings of the current signal for generating a rising edge on a current leading edge signal;
   fourth comparator means responsive to negative going zero voltage crossings of the current signal for generating a rising edge on a current trailing edge signal;

means for combining the voltage leading edge signal and the voltage trailing edge signal and generating therefrom a digitized voltage signal having rising edges corresponding to the rising edges of the voltage leading edge signal and falling edges corresponding to the rising edges of the voltage trailing edge signal;
and
means for combining the current leading edge signal and the current trailing edge signal and generating therefrom a digitized current signal having rising edges corresponding to the rising edges of the current leading edge signal, and falling edges corresponding to the rising edges of the current trailing edge signal.

6. The portable sensor instrument of claim 5 wherein the means for combining the digitized current signal and the digitized voltage signal comprises:

means for generating clock pulses;

means for generating a lead signal when the rising and falling edges of the digitized current signal preceed the corresponding rising and falling edges of the digitized voltage signal, a lead pulse on the lead signal being initiated by each rising and falling edge of the digitized current signal and terminated by the next rising or falling edge of the digitized voltage signal;

means for generating a lag signal when the rising and falling edges of the digitized voltage signal preceed the corresponding rising and falling edges of the digitized current signal, a lag pulse on the lag signal being initiated by each rising and falling edge of the digitized voltage signal and terminated by the next rising or falling edge of the digitized current signal;

means for enabling the clock pulses during the lead pulses;

means for enabling the clock pulses during the lag pulses.

7. The portable sensor instrument of claim 6 further comprising:

first counting means coupled for counting the clock pulses during the lead pulses for a selected period of time for accumulating a lead clock count (CTLD);

second counting means coupled for counting the clock pulses during the lag pulses for the selected period of time for accumulating a lag clock count (CTLG);

third counting means coupled for counting all clock pulses during the selected period of time for accumulating a total clock count (CTWI); and means for computing the phase angle $\phi$ in accordance with the relation $$\phi = 180 \frac{(CTLG - CTLD)}{CTWI}.$$

8. A portable sensor instrument for interconnection between a first conductor and a reference conductor comprising:

a potential probe assembly comprising:
  a non-conductive potential probe housing,
  a hook attached to one end of the potential probe housing for making electrical contact with the first conductor,
  a first capacitor mounted in the interior of the potential probe housing and electrically coupled to the hook;

a current probe assembly comprising:
  a non-conductive current probe housing,
  a second capacitor mounted in the interior of the current probe housing; and
  a sensing head assembly having mounted thereon a conductive plate means for making electrical contact with the reference conductor and a current sensing assembly for generating a current signal which has a fixed phase relationship to the current in the reference conductor;

a cable interconnecting the first capacitor and the second capacitor in series with the hook;

impedance means, the hook, the first and second capacitors, the impedance means and the conductive plate interconnected in series for generating a voltage signal across the impedance means which has a fixed phase relationship with the voltage between the first conductor and the reference conductor;

processing means coupled across the impedance means for receiving the voltage signal and further coupled to the current sensing assembly for receiving the current signal, the processing means comprising:

comparing means for comparing the voltage signal and the current signal for defining a measure of the phase difference therebetween, and display means for displaying the measure of the phase difference.

9. The portable sensor instrument of claim 8 wherein the current sensing assembly comprises a current transformer device having at least one coil and core for being positioned adjacent the reference conductor, the current signal being generated by the current induced in the coil and core in response to current in the reference conductor.

10. The portable sensor instrument of claims 8 or 9 wherein the first and second capacitors are high voltage ceramic capacitors.

11. The portable sensor instrument of claims 8 or 9 wherein the first and second capacitors have a capacitance of about 0.001 microfarads.

12. The portable sensor instrument of claim 8 wherein the comparing means comprise:

means for combining the voltage signal and the current signal and generating therefrom;

a lead signal having a relatively high voltage when the voltage signal and the current signal having opposite polarities, and a relative low voltage when the voltage and current signals have the same polarity, the relatively high voltage being generated only when the current signal leads the voltage signal;

a lag signal having a relatively high voltage when the current signal and the voltage signal have opposite polarities and a relatively low voltage when the voltage and current signals have the same polarities, the relatively high voltages being generated only when the current signal lags the voltage signal;

means for generating clock pulses; and means for enabling the clock pulses when the lead signal is relatively high for generating a lead pulse train, and when the lag signal is relatively high for generating a lag pulse train signal.

13. The portable sensor instrument of claim 12 wherein the means for comparing further comprises:

first counting means coupled for counting the clock pulses in the lead pulse train for a selected period of time for accumulating a lead clock count (CTLD);

second counting means coupled for counting the clock pulses in the lag pulse train for the selected period of time for accumulating a lag clock count (CTLG);

third counting means coupled for counting all clock pulses during the selected period of time for accumulating a total clock count (CTWI); and means for computing the phase angle $\phi$ in accordance with the relation $$\phi = 180 \frac{(CTLG - CTLD)}{CTWI}.$$

14. A portable sensor instrument for interconnection between a first conductor and a reference conductor comprising:

a potential probe comprising:
first contact means for making electrical contact with the first conductor, and a first capacitor;

a current probe comprising:
a sensing head having a second contact means for making electrical contact with the reference conductor and a current sensing assembly for generating a current signal which is substantially in phase with the current in the reference conductor comprising a Hall effect sensing device for being positioned adjacent to the reference conductor, the sensing device having a Hall current coordinate along which a Hall current flows positioned substantially perpendicular to the circumferential magnetic field of the reference conductor, and
a second capacitor;

a cable for interconnecting the first capacitor and the second capacitor;

an impedance means, the first contact means, the first and second capacitors, the impedance means and the second contact means interconnected in series for generating a voltage signal across the impedance means which is substantially in phase with the voltage between the first conductor and the reference conductor; and processing means coupled for receiving the current signal and the voltage signal, comprising:
means for digitizing the current signal and the voltage signal, means for combining the digitized current signal and the digitized voltage signal and generating therefrom a measure of the phase difference between the current signal and the voltage signal, and
means for displaying the measure of the phase difference.

15. A portable sensor instrument for interconnection between a first conductor and a reference conductor comprising:

a potential probe assembly comprising:
a non-conductive potential probe housing,
a hook attached to one end of the potential probe housing for making electrical contact with the first conductor,
a first capacitor mounted in the interior of the potential probe housing and electrically coupled to the hook;

a current probe assembly comprising:
a non-conductive current probe housing, a second capacitor mounted in the
interior of the current probe housing; and
a sensing head assembly having mounted thereon a conductive plate means for making electrical contact with the reference conductor and a current sensing assembly for generating a current signal which has a phase corresponding to the phase of the current flowing on the reference conductor, comprising a Hall effect sensing device for being positioned adjacent to the reference conductor, the sensing device having a Hall current coordinate along which a Hall current flows, positioned substantially perpendicular to the circumferential magnetic field induced by current in the reference conductor;

a cable interconnecting the first capacitor and the second capacitor in series with the hook;

impedance means, the hook, the first and second capacitors, the impedance means and the conductive plate interconnected in series for generating a voltage signal
across the impedance means which has a fixed phase relationship with the voltage between the first conductor and the reference conductor;

processing means coupled across the impedance means for receiving the voltage signal and further coupled to the current sensing assembly for receiving the current signal, the processing means comprising:
comparing means for comparing the voltage signal and the current signal for defining a measure of the phase difference therebetween, and display means for displaying the measure of the phase difference.

* * * * *